US012266534B2

(12) United States Patent
Chang et al.

(10) Patent No.: US 12,266,534 B2
(45) Date of Patent: Apr. 1, 2025

(54) FORMING A SEMICONDUCTOR DEVICE USING A PROTECTIVE LAYER

(71) Applicant: Tokyo Electron Limited, Tokyo (JP)

(72) Inventors: Shihsheng Chang, Albany, NY (US); Andrew Metz, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 364 days.

(21) Appl. No.: 17/316,214

(22) Filed: May 10, 2021

(65) Prior Publication Data

US 2021/0391181 A1   Dec. 16, 2021

Related U.S. Application Data

(60) Provisional application No. 63/039,314, filed on Jun. 15, 2020.

(51) Int. Cl.
*H01L 21/308* (2006.01)
(52) U.S. Cl.
CPC ...... *H01L 21/3086* (2013.01); *H01L 21/3081* (2013.01)
(58) Field of Classification Search
CPC ........... H01L 21/3065; H01L 21/30655; H01L 21/308; H01L 21/3081; H01L 21/3083; H01L 21/3086; H01L 21/3088; H01L 21/02274; H01L 21/02115; H01L 21/021; H01L 21/02123; H01L 21/02178; C23C 16/32; C23C 16/42
See application file for complete search history.

(56) References Cited

U.S. PATENT DOCUMENTS

| | | | |
|---|---|---|---|
| 6,261,962 B1 * | 7/2001 | Bhardwaj | ......... H01L 21/30655 257/E21.235 |
| 7,517,804 B2 | 4/2009 | Kiehlbauch et al. | |
| 2005/0103748 A1 | 5/2005 | Yamaguchi et al. | |
| 2005/0136682 A1 * | 6/2005 | Hudson | ............. H01L 21/31116 438/714 |

(Continued)

OTHER PUBLICATIONS

Antonelli et al., (2011). Patterning with Amorphous Carbon Thin Films; hereafter Antonelli, 10.13140/2.1.4619.9684 (Year: 2011).*

(Continued)

*Primary Examiner* — Yara B Green
*Assistant Examiner* — Fakeha Sehar
(74) *Attorney, Agent, or Firm* — Slater Matsil, LLP

(57) ABSTRACT

In certain embodiments, a method of forming a semiconductor device includes receiving a substrate having an etch mask layer that includes features for preserving corresponding portions of an underlying hard mask layer to be etched during an etching process. The method includes patterning the hard mask layer using the etch mask layer to gradually form a recess in the hard mask layer, the recess having a depth greater than a width of a top surface of a first feature of the etch mask layer, by performing the etching process. The etching process includes alternating between: depositing, using a first plasma, a silicon-containing protective layer over the etch mask layer and the hard mask layer such that the protective layer covers exposed surfaces of the hard mask layer; and subsequently etching, using a second plasma that comprises oxygen, the hard mask layer to form an incremental portion of the recess.

20 Claims, 14 Drawing Sheets

(56) References Cited

U.S. PATENT DOCUMENTS

| | | |
|---|---|---|
| 2007/0026677 A1* | 2/2007 | Ji ..................... H01L 21/0337 |
| | | 438/689 |
| 2008/0188082 A1 | 8/2008 | Chi et al. |
| 2010/0330805 A1 | 12/2010 | Doan et al. |
| 2011/0059617 A1 | 3/2011 | Mitchell et al. |
| 2012/0244709 A1 | 9/2012 | Igarashi et al. |
| 2016/0086817 A1* | 3/2016 | Kitagaito .......... H01L 21/31116 |
| | | 156/345.24 |
| 2016/0163557 A1 | 6/2016 | Hudson et al. |
| 2016/0163561 A1 | 6/2016 | Hudson et al. |
| 2016/0293609 A1 | 10/2016 | Jha et al. |
| 2017/0076955 A1 | 3/2017 | Hudson et al. |
| 2017/0125255 A1 | 5/2017 | Kakimoto et al. |
| 2018/0068862 A1 | 3/2018 | Terakura et al. |
| 2019/0088497 A1 | 3/2019 | Kitagaito et al. |
| 2019/0139830 A1 | 5/2019 | Xie et al. |
| 2020/0048550 A1 | 2/2020 | Kim et al. |
| 2020/0176322 A1* | 6/2020 | Lin ................... H01L 21/31116 |

OTHER PUBLICATIONS

International Searching Authority, Notification of Transmittal of the International Search Report and the Written Opinion of the International Searching Authority, or the Declaration, International Application No. PCT/US2021/036088, Mailing Date Sep. 27, 2021, 14 pages.

Taiwan Office Action, Taiwanese Patent Application No. 110121358, Sep. 27, 2024, 14 pages.

* cited by examiner

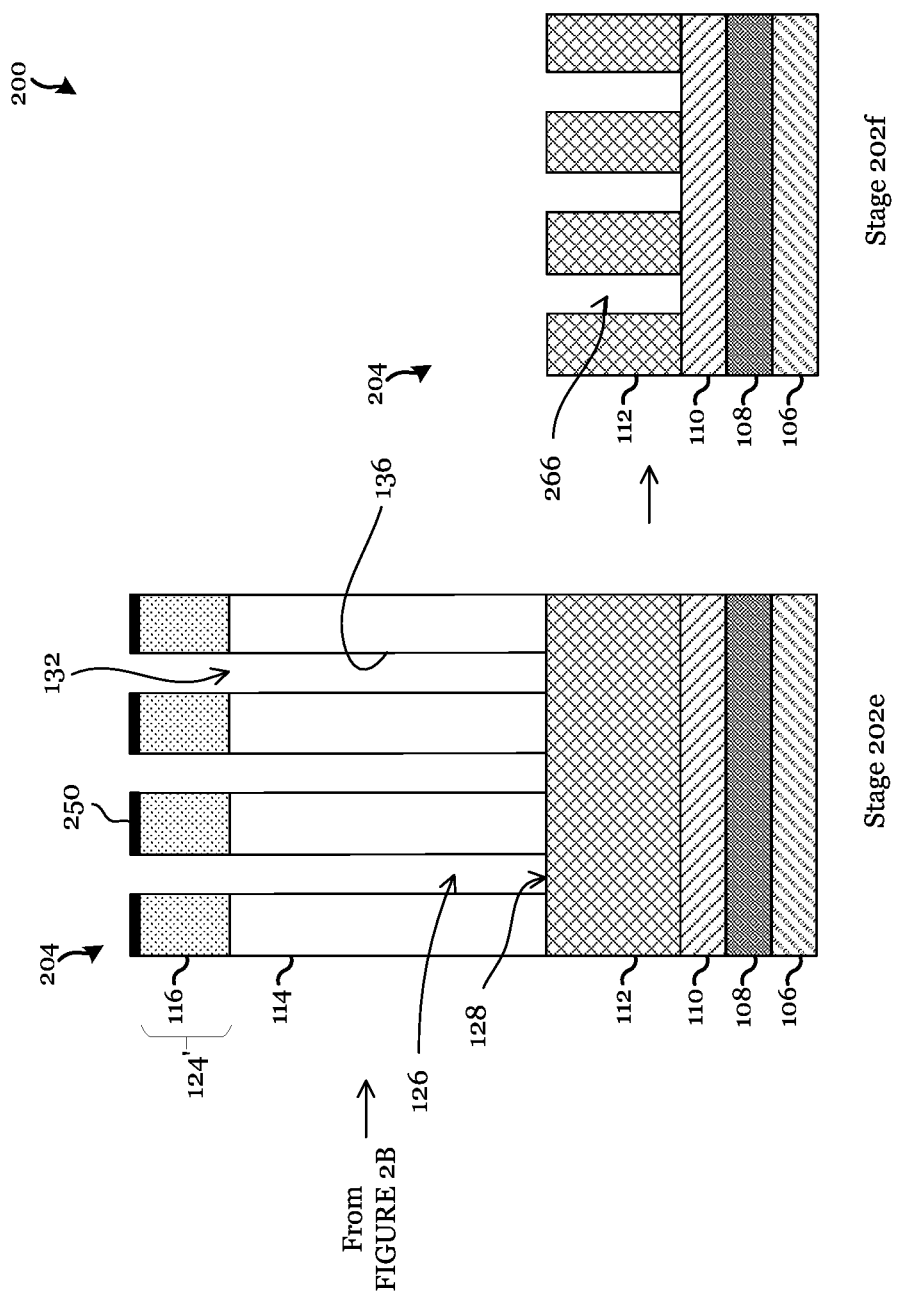

FORMING A SEMICONDUCTOR DEVICE USING A PROTECTIVE LAYER

CROSS-REFERENCE TO RELATED APPLICATIONS

This application claims the benefit of U.S. Provisional Application No. 63/039,314, filed on Jun. 15, 2020, which is incorporated by reference.

TECHNICAL FIELD

This disclosure relates generally to semiconductor fabrication, and, in particular embodiments, to forming a semiconductor device using a protective layer.

BACKGROUND

Generally, semiconductor devices are fabricated by sequentially depositing and patterning layers of materials over a semiconductor substrate. The semiconductor industry has repeatedly reduced the minimum feature sizes in semiconductor devices to a few nanometers to increase the packing density of components. In a lithography process, a patterned mask is used to form features. However, defects in the patterned mask may propagate to a feature being formed. Problems associated with such defects in the features being formed may be amplified at smaller technology nodes.

SUMMARY

In an embodiment, a method of forming a semiconductor device includes receiving a substrate having an etch mask layer that includes features for preserving corresponding portions of an underlying hard mask layer to be etched during an etching process. The method includes patterning the hard mask layer using the etch mask layer to gradually form a recess in the hard mask layer, the recess having a depth greater than a width of a top surface of a first feature of the etch mask layer, by performing the etching process. The etching process includes alternating between: depositing, using a first plasma, a silicon-containing protective layer over the etch mask layer and the hard mask layer such, the protective layer covering exposed surfaces of the hard mask layer; and subsequently etching, using a second plasma that comprises oxygen, the hard mask layer to form an incremental portion of the recess.

BRIEF DESCRIPTION OF THE DRAWINGS

For a more complete understanding of the present disclosure, and advantages thereof, reference is now made to the following descriptions taken in conjunction with the accompanying drawings, in which:

FIGS. 2A-2C illustrate cross-sectional views of a semiconductor device during a process for forming the semiconductor device, according to certain embodiments of this disclosure;

DETAILED DESCRIPTION OF ILLUSTRATIVE EMBODIMENTS

Figure 1:
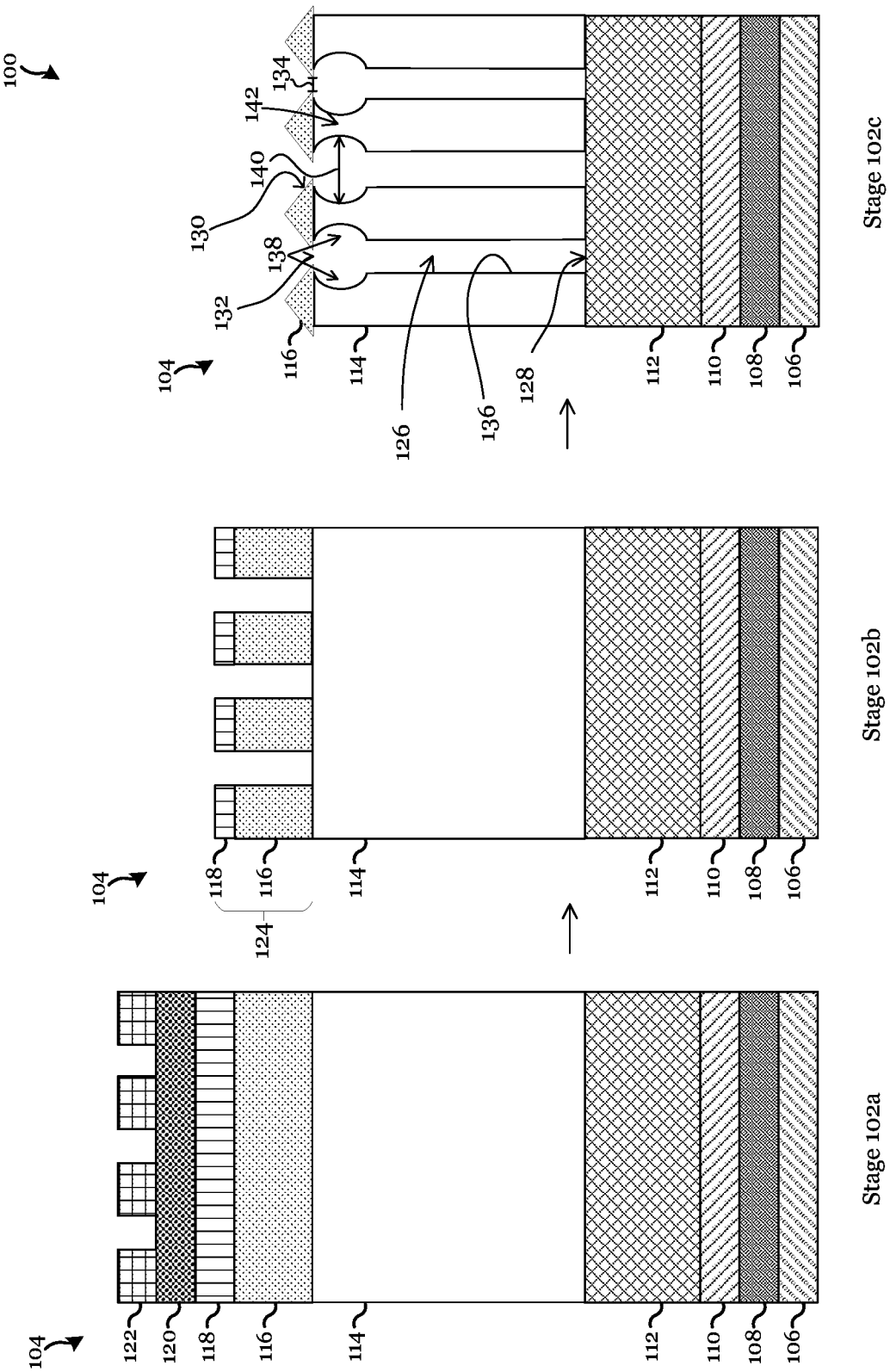
FIG. 1 illustrates cross-sectional views of a semiconductor device during a process for forming the semiconductor device and associated pattern defects that may occur.

Plasma processing techniques, such as reactive ion etching, plasma-enhanced chemical vapor deposition, plasma-enhanced atomic layer etch and deposition, sputter etch, physical vapor deposition, and cyclic plasma processing (e.g., cycles of alternating deposition and etch) are routinely used in fabricating ICs. For example, plasma processing techniques may be used to form circuit elements (e.g., contact holes, metal lines, fins, gate lines, vias, or other elements) by removing one or more layers of a semiconductor device. As described above, a patterned mask may be used to pattern an underlying layer during an etch process. The patterning defects described above that may be formed in a mask layer are transferred into underlying masks or other layers used to pattern circuit elements.

Fabricating certain circuit elements may include forming features in an underlying layer that have a high aspect ratio. The aspect ratio of a feature generally refers to the ratio of two-dimensions of the feature (e.g., height (or depth) vs. width). A high aspect ratio may describe a structure in which one dimension is significantly larger than the other dimension. As a particular example, features having a depth that is significantly greater than a width of the feature are frequently formed in layers of a semiconductor device.

As an example, a circuit element/feature may be a contact, and a recess formed in one or more layers during one or more etch processes may have a high aspect ratio in which the depth of the recess is significantly greater than a width of the recess. As a particular example, an organic layer (e.g., an amorphous carbon layer (ACL)) may be used as an etch mask in forming a recess (e.g., a contact hole). Prior to the organic layer being used as an etch mask, an overlying hard mask layer may be used as an etch mask to pattern recesses in the organic layer, and the depth of these recesses may be greater than the width of these recesses, possibly significantly.

A straight critical dimension profile in a high aspect ratio feature (e.g., a contact hole) may be important in certain devices. For example, preserving a straight critical dimension in a high aspect ratio contact etch for a memory device, such as a 3D-NAND or dynamic random access memory (DRAM) device may be difficult especially below 10 nm technology nodes.

Conventional techniques for etching features (e.g., recesses) that have a high aspect ratio into a layer to be etched may cause a number of pattern defects in the etched layer. Examples of these pattern defects are shown and described in greater detail below with reference to FIG. 1.

Accordingly, forming certain features (e.g., features having a high aspect ratio) using a plasma etch process may suffer from numerous pattern defects.

In certain embodiments of this disclosure, a cyclic etch process, such as a cyclic plasma etch process, is used to reduce or eliminate certain pattern defects that may occur when etching an underlying layer to have certain features, such as features having a high aspect ratio, more accurately preserving an intended profile and critical dimension of the feature. As described in greater detail below, rather than a single plasma etch step (whether recurring or not), the cyclic etch process of embodiments of this disclosure may include repeatedly performing two primary steps to gradually form features in an underlying layer to be etched: a deposition step to deposit a protective layer at least over portions of the underlying layer; and an etch step that forms a portion of the feature (e.g., the recess) in the underlying layer.

FIG. 1 illustrates cross-sectional views of a semiconductor device 104 during a process 100 for forming semiconductor device 104 and associated pattern defects that may occur. Process 100 includes stages 102a-102c. Throughout this disclosure, a "semiconductor device" also may be referred to as a semiconductor wafer or just wafer.

At stage 102a, semiconductor device 104 includes a substrate 106; intermediate layers 108 and no deposited over substrate 106; an underlying layer 112 deposited above intermediate layers 108 and 110; an underlying layer 114 deposited over underlying layer 112; intermediate layers 116, 118, and 120 deposited over an underlying layer 114; and a patterned layer 122 formed above intermediate layers 116, 118, and 120.

Substrate 106 may include silicon, silicon germanium, silicon carbide, compound semiconductors (e.g., gallium nitride, gallium arsenide, indium arsenide, indium phosphide, and others), or combinations of these materials or any other suitable material(s). Substrate 106 may include a semiconductor wafer that may include a semiconductor epitaxial layer including hetero epitaxial layers. As an example, one or more hetero epitaxial layers that include a compound semiconductor may be formed over substrate 106. In certain embodiments, a portion or the entirety of substrate 106 may be amorphous, polycrystalline, or single-crystalline. Substrate 106 may be doped, undoped, or contain both doped and undoped regions.

Semiconductor device 104 includes intermediate layers 108 and 110 and underlying layer 112, which collectively may be considered a bottom layer of semiconductor device 104. In certain embodiments, intermediate layers 108 and 110 and underlying layer 112 are a dielectric layer. Intermediate layers 108 and 110 and underlying layer 112 may include any suitable materials, such as (alone or in combination) silicon oxide, silicon nitride, or a combination of silicon oxide and silicon nitride (e.g., alternating oxide/nitride layers, such as those that might be used in a three-dimensional 3D-NAND stack). Each of intermediate layers 108 and 110 and underlying layer 112 are described further below.

Intermediate layer 108 may be an oxygen-containing layer. As just one example, intermediate layer 108 is approximately 10 nm to 30 nm thick; however, intermediate layer 108 may have any suitable thickness. Intermediate layer 110 may be a silicon-based layer, such as a silicon nitride layer. As just one example, intermediate layer 110 is approximately 200 nm to 250 nm thick; however, intermediate layer 110 may have any suitable thickness. Although these particular intermediate layers (intermediate layer 108 and intermediate layer 110) between substrate 106 and underlying layer 112 are illustrated and described, semiconductor device 104 may omit intermediate layers 108 and 110 and/or include different intermediate layers (with or without intermediate layer 108 and/or intermediate layer 110).

Underlying layer 112 is a layer that is to be patterned into one or more features, as described further below. The feature being etched into another layer (e.g., underlying layer 112 or, as described below, underlying layer 114) may be any suitable feature. For example, although this disclosure primarily describes "recesses" with respect to the figures of this disclosure, it will be appreciated that other suitable features might be formed in a semiconductor layer, including (whether or not considered "recesses") lines, holes, trenches, vias, and/or other suitable structures, using embodiments of this disclosure.

Underlying layer 112 may include a stack of films. As just a few examples, underlying layer 112 may include films of dielectric and/or conductive materials, such as oxide, silicon oxide, silicon nitride, silicon oxynitride, silicon carbide, titanium nitride, tantalum nitride, their alloys, and combinations thereof. For example, underlying layer 112 can be a dielectric layer or alternating dielectric layers. As a particular example, underlying layer 112 may be an oxide layer or alternating oxide/nitride layers. As just one example, underlying layer 112 is approximately 1 μm to 4 μm thick; however, underlying layer 112 may have any suitable thickness.

Underlying layer 114 is a layer that is to be patterned into one or more features, as described further below. Underlying layer 114 may include a stack of films. In certain embodiments, underlying layer 114 is an organic layer, such an ACL or a silicon carbide layer, which may be particularly suitable for forming features having a high aspect ratio. In certain embodiments, underlying layer 114 may be a sacrificial layer that is removed after being used as a hard mask in a subsequent etch step (e.g., for etching underlying layer 112).

As just one example, underlying layer 114 is approximately 200 nm to approximately 4 μm thick; however, underlying layer 114 may have any suitable thickness. Furthermore, the relative thicknesses of underlying layer 112 (possibly in combination with intermediate layers 108 and 110) and underlying layer 114 may have any suitable relationship. For example, underlying layer 112 (possibly in combination with intermediate layers 108 and 110) may be thicker than underlying layer 114, thinner than underlying layer 114, or the same thickness as underlying layer 114.

Underlying layer 114 may be deposited using any technique appropriate for the material to be deposited, including for example a spin-on coating process, a chemical vapor deposition process, or an atomic layer deposition process. For example, underlying layer 114 may be an ACL formed by chemical vapor deposition or atomic layer deposition.

Semiconductor device 104 includes intermediate layers 116, 118, and 120. Intermediate layer 116 may be a silicon oxynitride layer. In an example, intermediate layer 116 is approximately 120 nm to 300 nm thick. Intermediate layer 118 may be an organic dielectric layer. In an example, intermediate layer 118 is approximately 150 nm to 250 nm thick. Intermediate layer 120 may be silicon anti-reflective coating (SiARC) or other anti-reflective coating. In an example, intermediate layer 120 is approximately 20 nm to 40 nm thick. Although described as having particular example thicknesses, intermediate layers 116, 118, and 120 may have any suitable thickness. Although these particular intermediate layers 116, 118, and 120 are illustrated and described, this disclosure contemplates semiconductor device 104 omitting intermediate layers 116, 118, and/or 120 or including different intermediate layers (with or without intermediate layer 116, intermediate layer 118, and/or intermediate layer 120).

Patterned layer 122 may be a photoresist layer and patterned to facilitate formation of respective features in underlying layer 114. For example, patterned layer 122 may serve as an etch mask when forming features from underlying layer 114 such that features of patterned layer 122 cause corresponding features of underlying layer 114 to remain during a subsequent etch process, as described below. As just one example, patterned layer 122 is approximately 50 nm to 60 nm thick; however, patterned layer 122 may have any suitable thickness.

Patterned layer 122 may be formed using any suitable process. In certain embodiments, patterned layer 122 is a photoresist. Patterned layer 122 may be patterned using a lithography process, such as an extreme ultraviolet (EUV) lithography process or electron beam (e-beam) lithography process. The above-described bowing problems are more acute in deeply scaled technologies using EUV or e-beam lithography processes.

Features to be patterned using patterned layer 122 may have a desired critical dimension, or width, for patterned layer 122. As an example, the width may be about 70 nm to about 250 nm, and about 200 nm in a particular embodiment. As another example, the width may be about 70 nm to about 250 nm, and about 90 nm in a particular embodiment. These values are provided for example purposes only, as the features to be patterned using patterned layer 122 may have any suitable critical dimension. The width may be the critical dimension achievable for a photoresist film by the lithography system after developing.

Turning to stage 102b, a patterned layer 124 is formed by performing an etch process and using patterned layer 122 and intermediate layer 120 as an etch mask. Through this technique, a pattern defined by patterned layer 122 is transferred to patterned layer 124. Patterned layer 122, intermediate layer 120, and possibly some or all of intermediate layer 118 may be removed as part of this process, or may be subsequently removed. In the illustrated example, patterned layer 124 includes portions of both intermediate layer 116 and 118; however, this disclosure contemplates patterned layer 124 including only intermediate layer 116 and/or further including portions of intermediate layer 120.

As shown at stage 102c, underlying layer 114 has been patterned using patterned layer 124 as an etch mask. In certain embodiments, patterning underlying layer 114 includes performing an etch process to remove some or all of intermediate layer 118. That is, at stage 102c, an etch process has been performed on the semiconductor device 104 of stage 102b, to pattern underlying layer 114. The etch process may include one or multiple etch steps. Any suitable etching process for patterning underlying layer 114 may be used, including for example a wet etch process or a dry etch process (e.g., a plasma process). In the illustrated example, patterning underlying layer 114 using patterned layer 124 as an etch mask forms recesses 126 in underlying layer 114 until surface 128 of underlying layer 112 in respective recesses 126 of underlying layer 114 are exposed.

The etch process used to pattern underlying layer 114 creates one or more pattern defects in underlying layer 114, defects that may be exacerbated when the pattern is designed to form features (e.g., recesses 126) in underlying layer 114 that have a high aspect ratio. For example, recesses 126 shown at stage 102c have a significantly larger depth than width. The prolonged (and possibly repeated) etch process used to etch recesses 126 may, in part, cause the one or more pattern defects. Examples of these pattern defects are described below.

As a first example of pattern defects that may result from etching underlying layer 114 at stage 102c, corner erosion of intermediate layer 116, which may serve as a hard mask layer for patterning underlying layer 114, may occur, as shown at region 130, leaving an insufficient amount of intermediate layer 116 for subsequent etching. Corner erosion of intermediate layer 116 may result, at least in part, from the long periods of exposure to the plasma used to etch the relatively deep recesses 126 in underlying layer 114. Furthermore, corner erosion of intermediate layer 116 may cause intermediate layer 116 to have a triangular-like cross-sectional profile or a rounded corner, either of which may extend into openings 132 of recesses 126, such that openings 132 have a reduced width 134. This reduced width 134 creates a reduced critical dimension at openings 132. Additionally or alternatively, portions of intermediate layer 116 that are eroded during the etch process may be redeposited in areas that also reduce width 134, creating or exacerbating a reduced critical dimension at openings 132.

As another example of the pattern defects that may result from etching underlying layer 114 at stage 102c, the plasma etch process used to pattern underlying layer 114 (e.g., to create recesses in underlying layer 114) may create undesired variation in the vertical profile along sidewalls 136 of underlying layer 114 in recesses 126. It is often desirable to have a generally straight vertical profile along sidewalls 136 in recesses (such as contact holes) formed in an underlying layer.

The variations created by the etch process used to pattern underlying layer 114 may include a so-called "bowing" in the vertical profile along sidewalls 136, as shown at regions 138. This bowing generally occurs near the top of sidewalls 136. Bowing may be caused by the bending of incident ion trajectories of ions used during the plasma etching process. For example, the trajectory of ions may change at patterned layer 124, and ions may scatter (known as scattered ion flux) at sidewalls 136, particularly near the top of recesses 126, resulting in bowing of sidewalls 136. In certain scenarios, the scattering of ions during the plasma etch process may result, in part, from the corner erosion, and thereby the tapered (or rounded corner) shape, of intermediate layer 116.

The bowing in recesses 126 creates a widening of the critical dimension, as shown at width 140. Furthermore, the bowing reduces the amount of material of underlying layer 114 that remains after patterning underlying layer 114, as shown at region 142. This narrowing could ultimately cause underlying layer 114 to collapse, potentially closing an opening 132 in underlying layer 114, leaving underlying layer 114 (and subsequently underlying layer 112) unable to be etched/patterned as intended.

After the etch process that resulted in stage 102c, the pattern defects present in underlying layer 114, as patterned, may be propagated to additional underlying layers (e.g., underlying layer 112) when those underlying layers are patterned using underlying layer 114 (as patterned) as an etch mask. Ultimately, these pattern defects unintentionally modify the intended critical dimension of features formed using these patterned layers (e.g., underlying layers 112 and 114) as etch masks. Thus, the etching techniques that result in the pattern defects shown in stage 102c of semiconductor device 104 may continue to have undesirable effects in later fabrication stages.

In contrast to a typical plasma (or other) process that simply etches a layer to be etched (e.g., underlying layer 114) until a surface of a further underlying layer (e.g., surface 128 of underlying layer 112) is exposed, embodiments of this disclosure use a cyclic etch process that includes forming a protective layer at least on portions of a layer to be etched (e.g., underlying layer 114) and etching the layer to be etched. The protective layer may facilitate controlling the rate of etching of recesses in the layer to be etched, while reducing or eliminating pattern defects in the etched layer. In certain embodiments, the cyclic etch process is incorporated, for example, in the same plasma chamber used for the plasma etching that patterned layer 124. Embodiments incorporating a cyclic etch process and their potential advantages are described in greater detail below. In particular, variations on the cyclic etch process and how it may be incorporated into a larger process for forming a semiconductor device are described below.

Figure 2A:
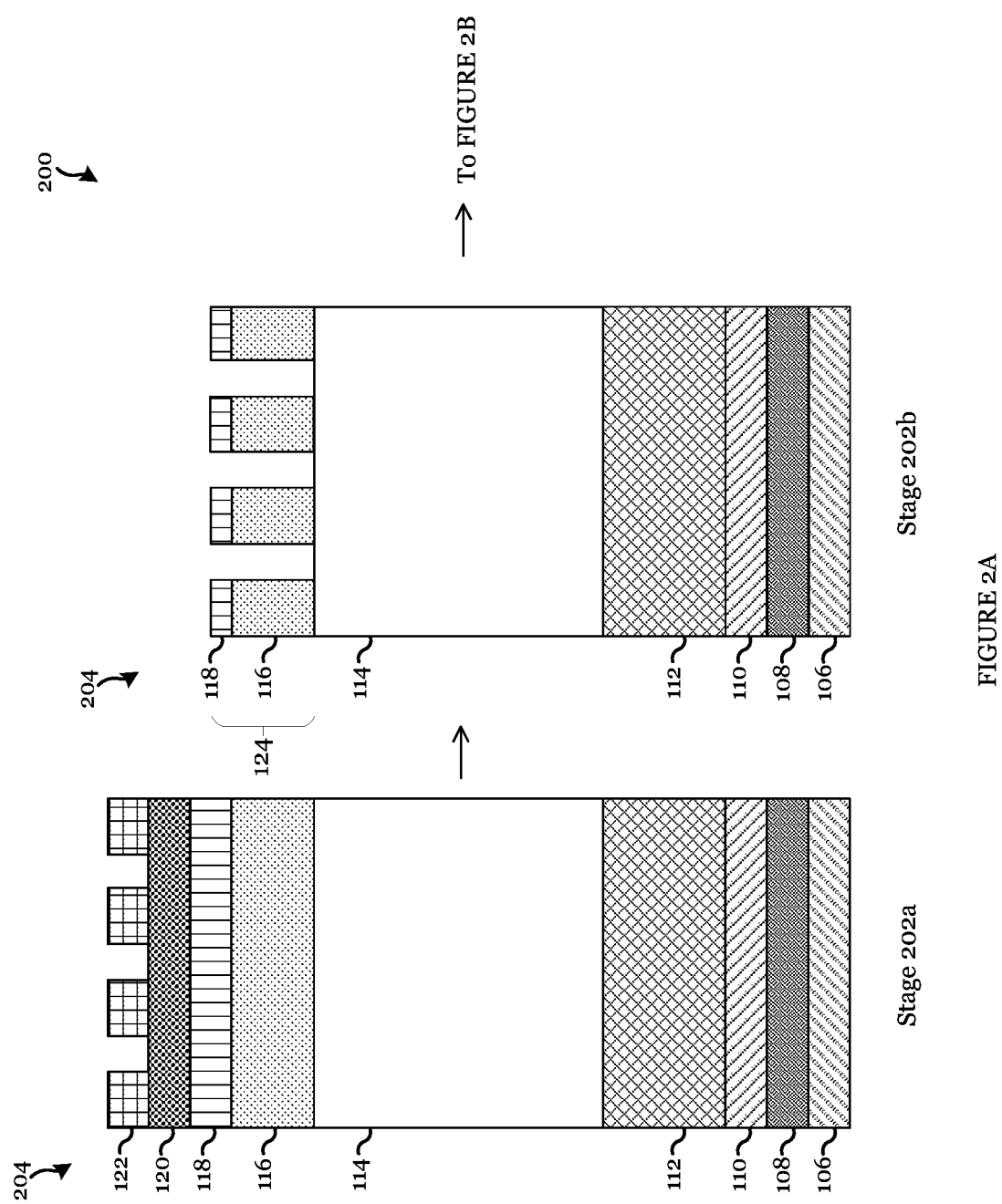
Figure 2B:
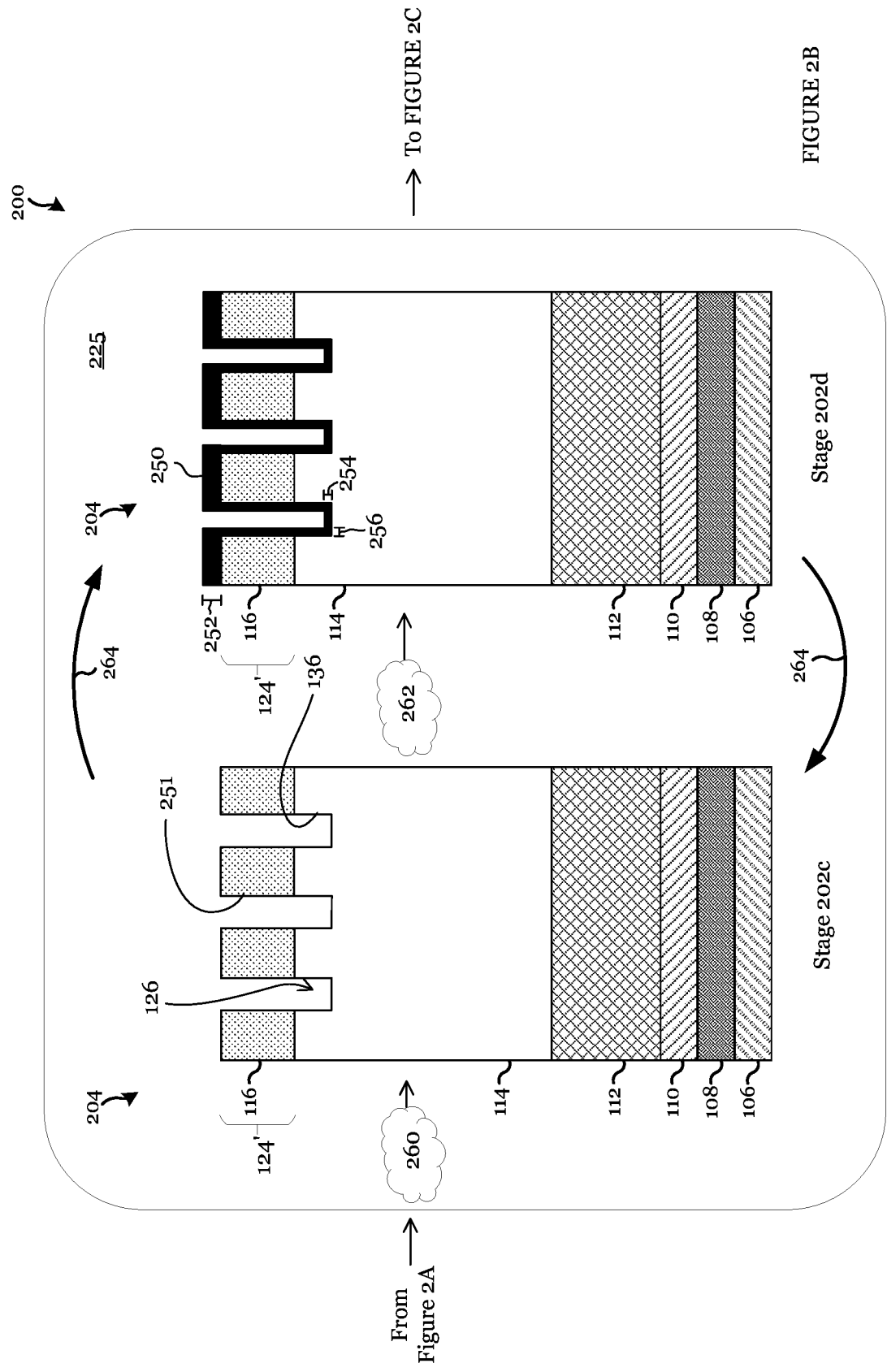

FIGS. 2A-2C illustrate cross-sectional views of a semiconductor device 204 during a process 200 for forming semiconductor device 204, according to certain embodiments of this disclosure. Process 100 includes stages 202a-202f.

In this example, certain aspects of semiconductor device 204 and process 200 may correspond to aspects of semiconductor device 104 and process 100 described above with reference to FIG. 1 and are not repeated. For example, stages 202a and 202b of process 200 generally correspond to stages 102a and 102b of process 100, respectively. As another example, at stage 202a, semiconductor device 204 includes layers that generally correspond to the layers of semiconductor device 104 at stage 102a in FIG. 1. Thus, the same reference numerals are used to refer to those layers in describing semiconductor device 204 of FIGS. 2A-2C, as well as in other figures of this disclosure. In particular, at stage 202a, semiconductor device 204 includes substrate 106, intermediate layer 108, intermediate layer 110, underlying layer 112, underlying layer 114, intermediate layer 116, intermediate layer 118, intermediate layer 120, and patterned layer 122, each of which may include the same materials as and include other shared features with the like-numbered layer of semiconductor device 104.

Turning to the stages that follow stage 202b in process 200, in contrast to a typical plasma (or other) etch process that simply etches a layer to be etched (e.g., underlying layer 114) until a surface of a further underlying layer (e.g., surface 128 of underlying layer 112) is exposed (e.g., as shown at stage 102c of FIG. 1), as shown in FIG. 2B embodiments of this disclosure use a cyclic etch process 225 to pattern an underlying layer (e.g., underlying layer 114) using a patterned layer 124 as an etch mask.

In the embodiment illustrated in FIG. 2B, cyclic etch process 225 includes two primary steps. A first step, as shown at stage 202c, is an etching step in which a portion of underlying layer 114 is etched using patterned layer 124 (in particular, in this example, patterned layer 124', as described further below) as an etch mask, and a second step, as shown stage 202d, is a deposition step in which a protective layer is deposited over at least a portion of underlying layer 114. Stages 202c and 202d are described in greater detail below.

At stage 202c, in the first step of cyclic etch process 225, a portion of underlying layer 114 is etched to gradually form recesses 126 in underlying layer 114. In a first pass through cyclic etch process 225, a partial etch of underlying layer 114 is performed to begin forming recesses 126 in underlying layer 114 according to the pattern defined by patterned layer 124. In the illustrated example, this initial etch process removes a portion of patterned layer 124 (from stage 202b), such that patterned layer 124 becomes patterned layer 124'.

For example, the initial etch process of stage 202c removes the portions of intermediate layer 118 that remained as part of patterned layer 124 at stage 202b. In one or more subsequent etches at stage 202c, recesses 126 are further extended into underlying layer 114 until top surface 128 of underlying layer 112 is exposed at the bottom of recesses 126 (see stage 202e described below).

The etch process used in the etch step of stage 202c may be an anisotropic etch process, according to particular implementation objectives. An anisotropic etch process may etch in a particular direction, such as a downward direction in recesses 126 to further extend recesses 126 into underlying layer 114. Of course, as described above, ion scattering may occur, which may cause unintended etching of other portions of semiconductor device 204. Despite the anisotropic nature of the etch step at stage 202c, certain chemistries in a plasma process chamber in which the etch step of stage 202c is performed may remove some or all of a protective layer (e.g., formed at stage 202d and present on subsequent passes through cyclic etch process 225) from sidewalls 136 of underlying layer 114 and/or sidewalls 251 of patterned layer 124' in recesses 126. For example, oxygen in a plasma possibly used in the etch step of stage 202c may remove some or all of protective layer 250 from sidewalls 136 of underlying layer 114 and/or sidewalls 251 of patterned layer 124' in recesses 126.

In certain embodiments, the etch step of stage 202c is designed to be selective so that it advantageously removes underlying layer 114 without removing underlying layer 112. Thus, the etch step of cyclic etch process 225 is designed to self-terminate once recesses 126 in the underlying layer 114 are fully formed such that surface 128 of underlying layer 112 is exposed at the bottom of recesses 126 in some embodiments.

The etch process of stage 202c may include one or multiple etch steps. In certain embodiments, the etch step of stage 202c is a plasma etch step performed using a plasma 260. In a particular example, plasma 260 used to etch underlying layer 114 includes oxygen and a sulfur-containing gas, such as silicon dioxide ($SO_2$) and/or carbonyl sulfide (COS) for example. Additional details of an example etch process of stage 202c are described below in combination with an example protective-layer deposition process of stage 202d.

At stage 202d, in the second step of cyclic etch process 225, a protective layer 250 is deposited at least over portions of the layer to be etched (e.g., underlying layer 114). In certain embodiments, protective layer 250 is deposited on one or more of a top surface of patterned layer 124', a top surface of underlying layer 114 (e.g., at the bottoms of recesses 126), or sidewalls 251 of patterned layer 124 and sidewalls 136 of underlying layer 114 in recesses 126. For example, in any suitable combination, protective layer 250 may be deposited over a top surface of the layer to be etch (e.g., underlying layer 114) exposed at the bottom of recesses 126, along sidewall surfaces in recesses 126 (e.g., sidewalls 251 of patterned layer 124' and sidewalls 136 of underlying layer 114), and over top surfaces of patterned layer 124'. In the illustrated example, protective layer 250 is deposited over patterned layer 124' and portions of underlying layer 114 exposed in recesses 126.

Protective layer 250 may be a silicon-containing layer. In certain embodiments, the deposition process of stage 202d is a plasma deposition process performed using a plasma 262. In a particular example, plasma 262 used to deposit protective layer 250 includes a silicon-based precursor and a carrier gas. In one example, the silicon-based precursor of plasma 262 is silicon tetrachloride (SiCl$_4$) or silicon tetrafluoride (SiF$_4$). In one example, the carrier gas of plasma 262 includes at least one of helium (He), nitrogen (N$_2$), hydrogen (H$_2$), or argon (Ar). Additional details of an example protective-layer deposition process of stage 202d are described below in combination with an example etch process of stage 202c.

In general, depending on the thickness(es), options for which are described in greater detail below, and locations of protective layer 250, protective layer 250 may protect patterned layer 124' and suitable portions of underlying layer 114 from being etched during the etch step of stage 202c. It should be understood that throughout this disclosure, references to protective layer 250 protecting another layer from etching might or might not be complete protection of the other layer from all etching, whether by ion scattering or otherwise.

For example, protective layer 250 over patterned layer 124' and/or along sidewalls 251 of patterned layer 124' at the tops of recesses 126 protects patterned layer 124' from etching during the etch step of stage 202c, which may reduce or eliminate corner erosion of patterned layer 124' and/or extension of patterned layer 124' into openings at the tops of recesses 126. Furthermore, the improved preservation of patterned layer 124' may reduce ion scattering during the etch step of stage 202c (in the case of an plasma etch process), which may reduce or eliminate bowing along the vertical profile of sidewalls 136 of underlying layer 114 in recesses 126 and thereby improve a critical dimension of recesses 126. As another example, protective layer 250 over patterned layer 124' and/or along sidewalls 251 of patterned layer 124' at the tops of recesses 126 may partially or wholly compensate for possible loss to (e.g., corner erosion of) patterned layer 124' from etching during the etch step of stage 202c.

As another example, protective layer 250 along sidewalls 136 of underlying layer 114 in recesses 126 protects sidewalls 136 from etching during the etch step of stage 202c, which may reduce or eliminate bowing along the vertical profile of sidewalls 136 of underlying layer 114 in recesses 126. In certain embodiments, protective layer 250 along sidewalls 136 of underlying layer 114 in recesses 126 protects sidewalls 136 from etching during the etch step of stage 202c even if ion scattering occurs during the etch step.

The process used to deposit protective layer 250 may be an anisotropic or isotropic process, according to implementation objectives. An anisotropic process may form a protective layer 250 having different thicknesses at different locations. An isotropic process may form a protective layer 250 that has a generally uniform (though not necessarily identical) thickness. In certain embodiments, the plasma process used to deposit protective layer 250 is a one-step continuous plasma process; however, any suitable process may be used for depositing protective layer 250, including, for example, a multi-step atomic layer deposition process.

Protective layer 250 may be formed to a first thickness 252 over top surfaces of patterned layer 124', a second thickness 254 along top surfaces of underlying layer 114 exposed by pattern layer 124' (e.g., at the bottom of recesses 126), and to a third thickness 256 over sidewalls 136 and sidewalls 251 in recesses 126. First thickness 252, second thickness 254, and third thickness 256 each may be any suitable thickness and have any suitable values relative to one another (including all being the same thickness, all being different thicknesses, or two of the three thicknesses matching with another thickness being different).

In a particular example, first thickness 252 is greater than second thickness 254. In such an example, aside from an initial pass of semiconductor device 204 through cyclic etch process 225 (in which protective layer 250 of stage 202d has not yet been deposited), a portion of the protective layer 250 that is deposited over top surfaces of patterned layer 124' remains over the top surfaces of patterned layer 124' even after the etch process. The relative thicknesses of this particular example may allow the etch process of stage 202c to remove protective layer 250 from top surfaces of underlying layer 114 at the base of recesses 126 such that the etch process of stage 202c also can extend recesses 126 into underlying layer 114, while a portion of the protective layer 250 over the top surfaces of patterned layer 124' remains. Protective layer 250 over the top surfaces of patterned layer 124' protects patterned layer 124' from corner erosion and from extending into an opening at the top of recesses 126. In this example, first thickness 252 may also be greater than third thickness 256, which may facilitate removing protective layer 250 from sidewalls 136 of underlying layer 114 and patterned layer 124' in recesses 126 during the etch process of stage 202c, while ensuring that protective layer 250 remains over patterned layer 124'. Thus, the thicknesses of protective layer 250 may facilitate the gradual etching of recesses 126 in underlying layer 114.

As shown by arrows 264, the steps of cyclic etch process 225 may be repeated one or more times to gradually form recesses 126 in underlying layer 114. Cyclic etch process 225 may be performed any suitable number times. In certain embodiments, each cycle through cyclic etch process 225 is capable of further extending recess 126 into underlying layer 114. The appropriate number of cycles for performing cyclic etch process 225 for a given implementation depends on various factors, including the material of underlying layer 114; the material of protective layer 250; the desired critical dimension of recesses 126 (or another feature being formed in a layer to be etched); the acceptable amount of bowing, erosion of patterned layer 124', and/or other possible pattern defects; the acceptable amount of time that cyclic etch process 225 may introduce to the entire process of fabricating semiconductor device 204; the substance(s) (e.g., gas(es)) used as part of cyclic etch process 225, including the substance(s) used to etch underlying layer 114 and the substance(s) used to deposit protective layer 250; and/or other suitable factors.

In certain embodiments, the appropriate number of cycles for performing cyclic etch process 225 is predetermined (prior to production fabrication runs) by processing test wafers. A wafer (e.g., semiconductor device 204) may be sampled at a variety of stages to measure aspects of the wafer, including critical dimension of the feature being etched (e.g., recesses 126) and one or more possible pattern defects. For example, samples may be analyzed after one or more of stage 202a, stage 202b, one or more cycles of cyclic etch process 225 (after stage 102c and/or stage 202d), stage 202e, or stage 202f.

As a more particular example, a first wafer may be sampled after a first predetermined number of cycles of cyclic etch process 225, stopping after an instance of the etch step of stage 202c such that the last cycle of cyclic etch process 225 is not a complete cycle, and the measurements of characteristics such as critical dimension of recesses 126 and for possible pattern defects may be compared to desired values for those characteristics (e.g., to a technology node parametric). Furthermore, a determination may be made whether surface 128 of underlying layer 112 is exposed at the bottoms of recesses 126. A determination then may be made whether to test a new wafer after a second predetermined number of cycles less than or greater than the first predetermined number of cycles, depending on the results of the comparisons and other factors (e.g., any one of the other above-listed factors). This process of sampling may be repeated until a suitable number of cycles is determined.

Furthermore, adjustments to the steps of cyclic etch process 225 also may be determined as part of this testing and analysis. For example, different exposure times of semiconductor device 204 to plasma 260 and/or plasma 262 may be analyzed to determine the effect on a critical dimension of recesses 126 and other factors. As another example, different thicknesses of protective layer 250 may be analyzed to determine the effect of the thickness of protective layer 250 on critical dimension, time of cyclic etch process 225 (until exposure of surface 128 of underlying layer 112 at the bottoms of recess 126), and possible pattern defects.

Characteristics, such as critical dimensions and pattern defects of semiconductor device 204 may be measured using optical techniques such as scatterometry, a scanning electron microscope (SEM), transmission electron microscope (TEM), high-resolution TEM (HR-TEM), scanning probe microscope (SPM), atomic force microscope (AFM), scanning tunneling microscope (STM), or other suitable devices.

The above-described techniques for determining an appropriate number of cycles of cyclic etch process 225 is provided as an example only, as any suitable technique may be used.

Turning to the process conditions and associated parameters for the etch step of stage 202c and the protective-layer deposition step of stage 202d, in an example, both the etch step of stage 202c and the protective-layer deposition step of stage 202d may be performed using plasma processes.

In certain embodiments, the steps of cyclic etch process 225 may be executed in a same plasma process chamber of a plasma system. As just one example, the plasma system may be an inductively coupled plasma (ICP) tool in which the source radio frequency (RF) power and bias RF power are decoupled. A purge of the gases within the plasma process chamber might or might not be performed between the steps of cyclic etch process 225, depending on implementation details. For example, purging the plasma process chamber between stages 202c and 202d may reduce the opportunity for gases used in the etch step (stage 202c) to remain in the plasma process chamber during the protective layer deposition step (stage 202d) and interfere with the deposition step. As another example, given the cyclic nature of cyclic etch process 225, purging the plasma process chamber between stages 202d and a recurrence of stage 202c may reduce the opportunity for gases used in the protective layer deposition step to remain in the plasma process chamber during the etch step and interfere with the etch step. Alternatively, this disclosure contemplates not performing a purge at one or both of these times (between stages 202c and 202d and/or between stages 202d and a recurrence of stage 202c).

Example process conditions and associated parameters to be considered include: the plasma system parameters for each of stage 202c and stage 202d (e.g., the gases and respective amounts to be introduced into a plasma process chamber, the pressure to be applied, the source RF power and bias RF power to be used, the temperature, the time, the number of times to perform each of stages 202c and 202d (e.g., the number of cycles), whether the process parameters are different for any instances of stages 202c and 202d, whether to purge the plasma process chamber between process steps (in embodiments in which stages 202c and 202d are performed in the same plasma process chamber), target thicknesses of protective layer 250 and the locations of protective layer 250 (including whether an anisotropic deposition process is to be used to achieve different thickness and the associated process conditions), a desired amount of extension of recesses 126 into underlying layer 114 with each performance of the etch step of stage 202c), and/or any other suitable process conditions and associated parameters.

The selected process conditions and associated parameters may be determined according to a variety of factors, such as certain of those factors described above with reference to determining an appropriate number of cycles of cyclic etch process 225 (e.g., the desired critical dimension of recesses 126 (or another feature being formed in a layer to be etched); the acceptable amount of bowing, erosion of patterned layer 124', and/or other possible pattern defects; the acceptable amount of time that cyclic etch process 225 may introduce to the entire process of fabricating semiconductor device 204; and/or other suitable factors).

Furthermore, the selected process conditions and associated parameters for the etch step of stage 202c and the protective-layer deposition step of stage 202d may be optimized with respect to each other. For example, the process conditions and associated parameters selected for the protective-layer deposition step of stage 202d (e.g., including the material and thickness(es) of protective layer 250) may affect the appropriate selection of process conditions and associated parameters for the etch step of stage 202c, and vice versa. Thus, to achieve the optimal combination of processes that achieves one or more of the above-described factors, it may be appropriate to consider the process conditions and associated parameters for the etch step of stage 202c and the protective-layer deposition step of stage 202d in combination.

Particular example process conditions for an example cyclic etch process 225 are described below. In these examples, both steps of cyclic etch process 225 (e.g., etch and deposition associated with stages 202c and 202d, respectively) are plasma processes. These process conditions are provided for example purposes only. Any suitable process conditions for performing cyclic etch process 225 may be used.

In certain embodiments, the etch step of stage 202c may include exposing semiconductor device 204 to a first plasma (e.g., plasma 260) formed from an oxygen-containing gas (e.g., $O_2$) or a nitrogen ($N_2$) or argon (Ar)-containing gas, in combination with a sulfur-containing gas (e.g., $SO_2$ or COS). In this example, both source RF power and bias RF power are on for the etch step of stage 202c, and the etch step is approximately one to two minutes. In this example, between the etch step of stage 202c and the protective-layer deposition step of stage 202d, no purge of the plasma process chamber is performed. In certain embodiments, the protective-layer deposition step of stage 202d may include exposing semiconductor device 204 to a second plasma (e.g., plasma 262) formed from a silicon-based precursor (e.g., $SiCl_4$, $SiF_4$, or any suitable low temperature oxide (LTO)) and a carrier gas (e.g., He, $N_2$, $H_2$, or Ar). In this example, the source RF power is on and the bias RF power is off for the protective-layer deposition step of stage 202d, and the protective-layer deposition step of stage 202d is approximately ten to twenty seconds. In certain embodiments, cyclic etch process 225 is repeated ten to twenty times. In certain embodiments, a final "cycle" through cyclic etch process 225 stops after an instance of the etch step of stage 202c such that the last cycle of cyclic etch process 225 is not a complete cycle.

In a first particular example embodiment, process conditions and associated parameters for the etch step (stage 202c) and protective layer deposition step (stage 202d) of cyclic etch process 225 may include the following. For stage 202c: an etch time of 60 seconds, a pressure of 15 mtorr, a source power of 1500 W, a bias power of 400 W, an O2 flow rate of 300 sccm, an SO2 flow rate of 150 sccm, and an argon (Ar) flow rate of 50 sccm. For stage 202d: a deposition time of 10 seconds, a pressure of 50 mtorr, a source power of 500 W, a bias power of 0 W, a SiCl4 flow rate of 15 sccm, an H2 flow rate of 240 sccm, and an Ar flow rate of 50 sccm. In one example, cyclic etch process 225 is performed 10 times.

In a second particular example embodiment, process conditions and associated parameters for the etch step (stage 202c) and protective layer deposition step (stage 202d) of cyclic etch process 225 may include the following. For stage 202c: an etch time of 60 seconds, a pressure of 15 mtorr, a source power of 1500 W, a bias power of 400 W, an O2 flow rate of 200 sccm, a SO2 flow rate of 200 sccm, and an Ar flow rate of 50 sccm. For stage 202d: a deposition time of 5 seconds, a pressure of 50 mtorr, a source power of 500 W, a bias power of 0 W, a SiCl4 flow rate of 15 sccm, an H2 flow rate of 240 sccm, and an N2 flow rate of 50 sccm. In one example, cyclic etch process 225 is performed 15 times.

In certain embodiments, and depending on various process conditions, performing an etch step (e.g., stage 202c) before a protective-layer deposition step (e.g., stage 202d), as is done in cyclic etch process 225 of process 200, may reduce a number of times protective layer 250 is deposited by at least one relative to other examples of cyclic etch processes in which the protective layer 250 is deposited prior to the etch step. The pattern defects that can result from etching underlying layer 114 without protective layer 250 are generally minimal or non-existent when the etch process is short relative to the prolonged etch process to fully etch recesses in underlying layer 114. The prolonged etch process according to conventional techniques is largely responsible creating the pattern defects in recesses 126. Because of this and the relatively short time for an initial partial etch of underlying layer 114 on an initial pass through cyclic etch process 225, a risk of creating pattern defects by performing the partial etch on a first instance of stage 202c may be relatively low while potentially reducing a number of times protective layer 250 is deposited.

At stage 202e of FIG. 2C, cyclic etch process 250 has completed and recesses 126 in underlying layer 114 have been completed such that surface 128 of underlying layer 112 is exposed at the bottoms of recesses 126. Additionally, a portion of protective layer 250 remains above top surfaces of patterned layer 124' (e.g., intermediate layer 116). Given that in this example a portion of protective layer 250 remains above top surfaces of patterned layer 124' but not over exposed surfaces of underlying layer 114 at the bottom of or over the sidewalls 136 and 251 in recesses 126, the final pass through cyclic etch process 225 did not include performing the protective-layer deposition step of stage 202d.

Although FIG. 2C shows a portion of protective layer 250 remaining above top surfaces of patterned layer 124', this disclosure also contemplates protective layer 250 being completely removed from top surfaces of patterned layer 124'. For example, after any or all performances of the etch process of stage 202c, protective layer 250 may be completely removed from top surfaces of patterned layer 124', and a portion of patterned layer 124' (e.g., intermediate layer 116) also may be removed. Although in this scenario a portion of patterned layer 124' may be removed by the etch process performed at stage 202c (possibly resulting in a reduction in height of patterned layer 124' relative to its height prior to entering cyclic etch process 225), the etched portion of patterned layer 124' may be reduced relative to techniques that do not include depositing protective layer 250 on top surfaces of patterned layer 124'.

As shown in stage 202e, a vertical profile of sidewalls 136 of underlying layer 114 in recesses 126 has improved in that bowing of the sidewalls 136 of underlying layer 114 has been reduced or eliminated. Additionally, erosion of patterned layer 124' (e.g., remaining portions of intermediate layer 116) has been reduced or eliminated. As yet another example, protrusion of patterned layer 124' (e.g., remaining portions of intermediate layer 116) into openings at the top of recesses 126 in underlying layer 114 has been reduced or eliminated.

In certain embodiments, in a sixth stage, stage 202f, remaining portions of protective layer 250 (to the extent present), patterned layer 124', and underlying layer 114 are used as an etch mask to pattern underlying layer 112. Remaining portions of protective layer 250, patterned layer 124', and underlying layer 114, and underlying layer 112 may be etched using any suitable process (including any suitable number and combination of deposition and etching steps), such as a dry etch process (e.g., a plasma etch process), a wet etch process, and/or a cyclic etch process similar to cyclic etch process 225. In certain embodiments, one or more of the etch steps of stage 202f are performed in a different plasma system that the one used for cyclic etch process 225; however, one or more of the etch steps of stage 202f may be performed in the same plasma system as the one used for cyclic etch process 225.

At stage 202f, remaining portions of underlying layer 112 generally correspond to remaining portions of underlying layer 114 from stage 202e. That is, underlying layer 114 from stage 202e serves as an etch mask for etching underlying layer 112, such that recesses 266 are formed in underlying layer 112 that correspond to recesses 126 of underlying layer 114 from stage 202e. The potentially improved vertical profile of remaining portions of underlying layer 114 (and thereby the potentially improved vertical profile of recesses 126) at stage 202e may facilitate improving the vertical profile of remaining portions of underlying layer 112 (and thereby the vertical profile of recesses 266) when the underlying layer 114 of stage 202e is used as an etch mask to pattern underlying layer 112. In other words, in certain embodiments, because recesses 126 of underlying layer 114 have an improved vertical profile, those improvements may be propagated to recesses 266 formed in underlying layer 112.

Figure 3A:
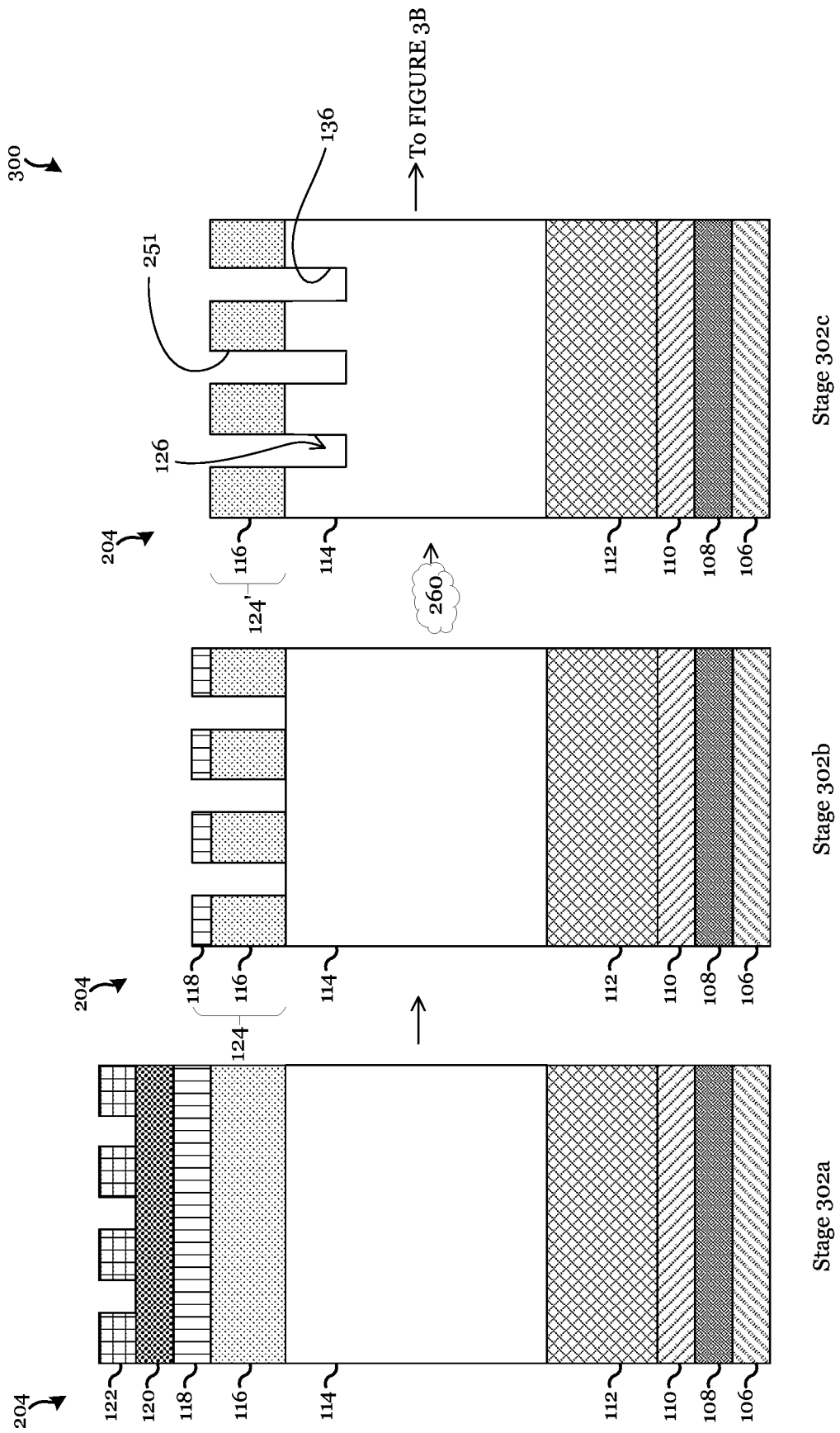
FIGS. 3A-3C illustrate cross-sectional views of a semiconductor device during a process for forming the semiconductor device, according to certain embodiments of this disclosure.
Figure 3B:
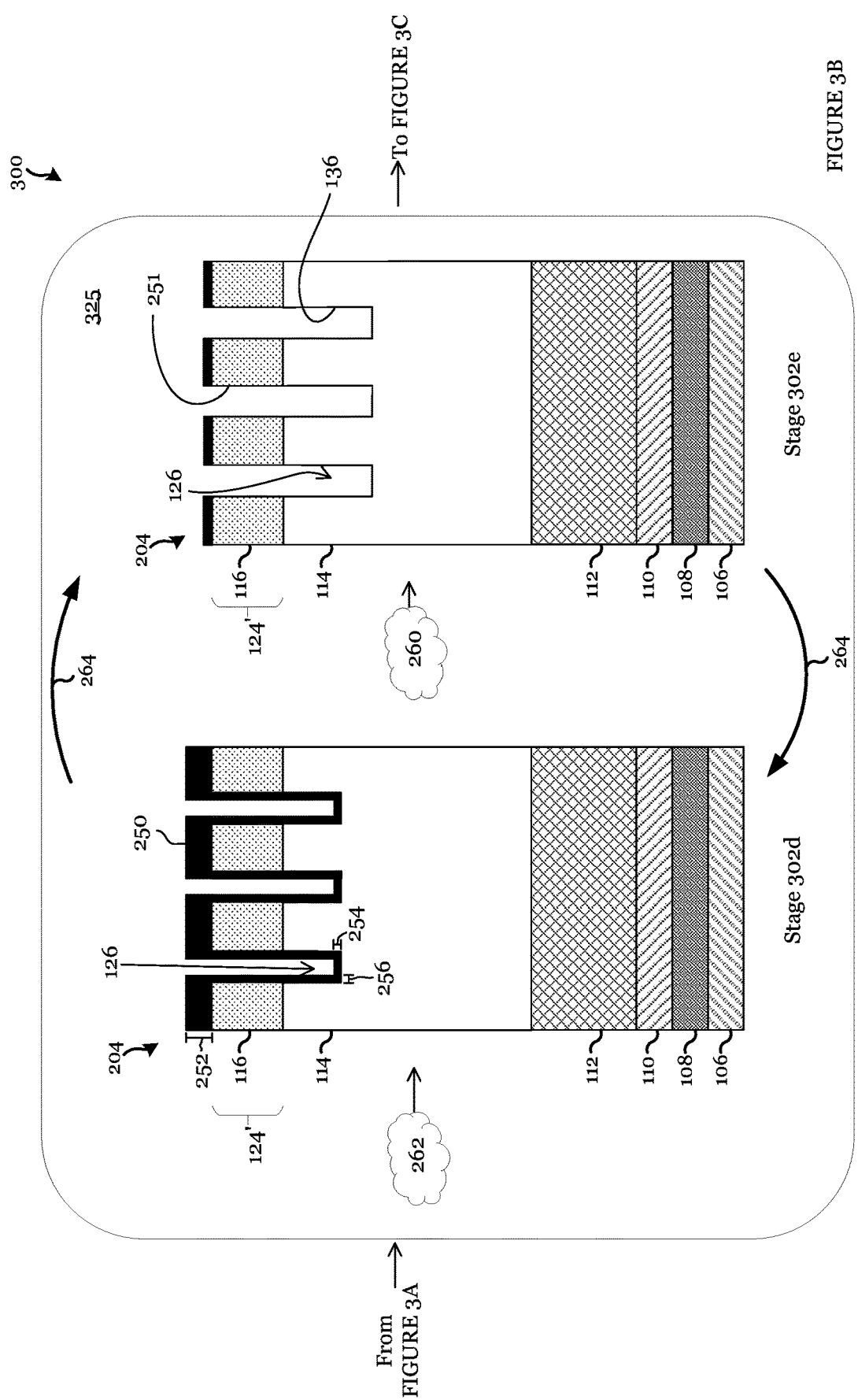
Figure 3C:
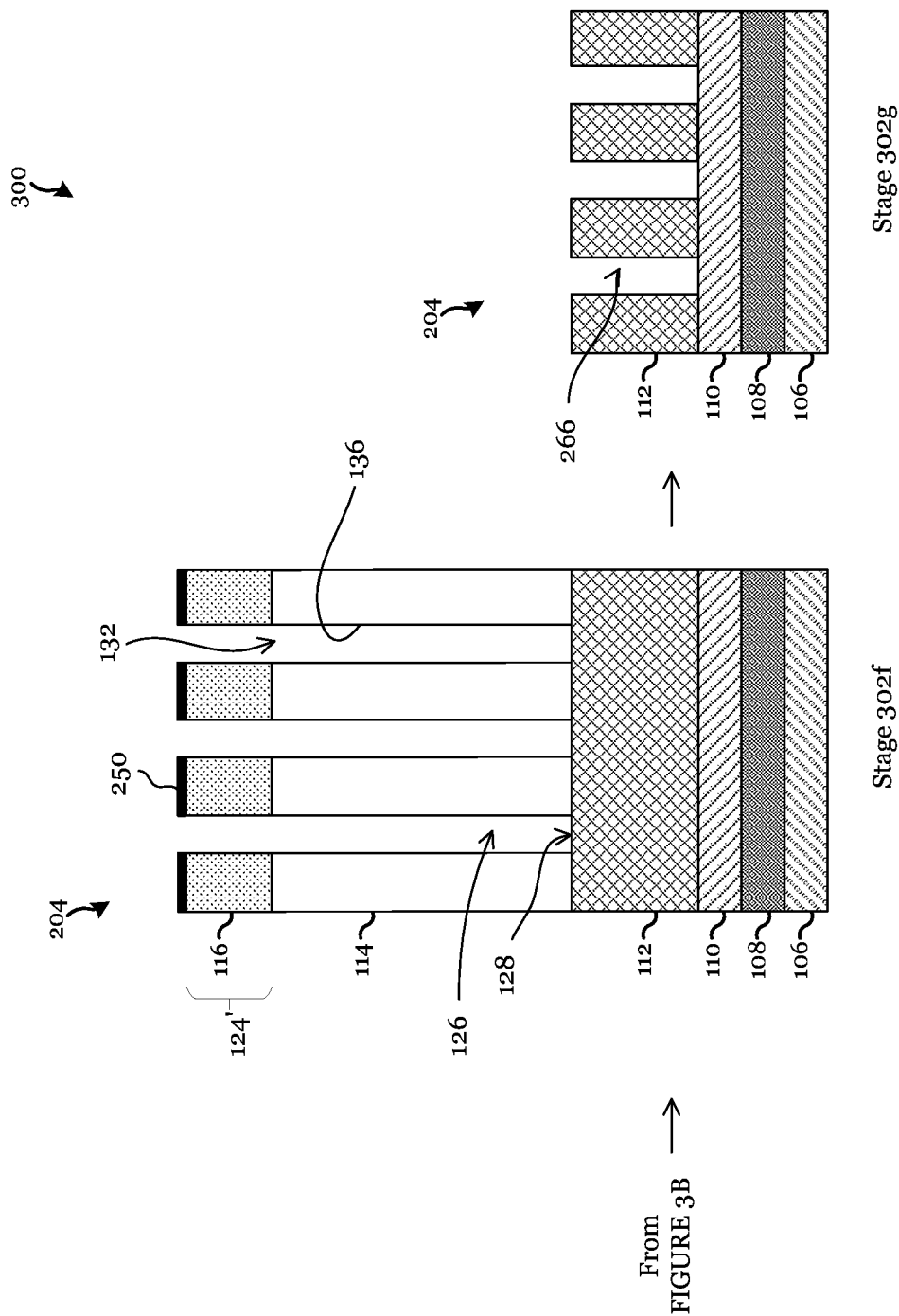

FIGS. 3A-3C illustrate cross-sectional views of semiconductor device 204 during a process 300 for forming semiconductor device 204, according to certain embodiments of this disclosure. Process 300 is analogous to process 200 of FIGS. 2A-2C in many respects; however, as described in greater detail below, process 300 includes a pre-etch of underlying layer 114 prior to beginning a cyclic etch process 325, and in cyclic etch process 325 an order of a protective-layer deposition step and an etch step are reversed relative to the analogous steps in cyclic etch process 225 of process 200.

Process 300 includes stages 302a-302g. In this example, certain aspects of process 300 may correspond to aspects of process 100 and/or process 200 described above with reference to FIGS. 1 and 2A-2C and are not repeated. For example, stages 302a and 302b of process 300 generally correspond to stages 202a and 202b of process 200, respectively, and to stages 102a and 102b of process 100, respectively. As another example, at stage 302a (as was the case at stage 202a), semiconductor device 204 includes substrate 106, intermediate layer 108, intermediate layer 110, underlying layer 112, underlying layer 114, intermediate layer 116, intermediate layer 118, intermediate layer 120, and patterned layer 122, each of which may include the same materials as and include other shared features with the like-numbered layer of semiconductor device 104.

Turning to the stages that follow stage 302b, in contrast to a typical plasma (or other) etch process that simply etches a layer to be etched (e.g., underlying layer 114) until a surface of a further underlying layer (e.g., surface 128 of underlying layer 112) is exposed (e.g., as shown at stage 102c), process 300 includes a pre-etch step at stage 302c, followed by cyclic etch process 325 to pattern an underlying layer (e.g., underlying layer 114) using a patterned layer 124 as an etch mask, and cyclic etch process 325 includes forming a protective layer 250 at least on portions of a layer to be etched (e.g., underlying layer 114) and etching the layer to be etched. This pre-etch is also different from process 200, which lacks a pre-etch of underlying layer 114 prior to beginning cyclic etch process 225.

At stage 302c, a pre-etch of underlying layer 114 is performed. In particular, at stage 302c, a portion of underlying layer 114 is etched, which begins forming recesses 126 in underlying layer 114. The etch of stage 302c may be referred to as a pre-etch because it occurs prior to beginning cyclic etch process 325. In certain embodiments, the pre-etch of stage 302c is performed to begin forming recesses 126 in underlying layer 114 according to the pattern defined by patterned layer 124. Furthermore, in the illustrated example, the pre-etch of stage 302c removes a portion of patterned layer 124 (from stage 302b), such that patterned layer 124 becomes patterned layer 124'. For example, the pre-etch process of stage 302c removes the portions of intermediate layer 118 that remained as part of patterned layer 124 at stage 302b.

In certain embodiments, the pre-etch step of stage 302c is a plasma etch step performed using a plasma 260. In a particular example, plasma 260 used to etch underlying layer 114 includes oxygen and a sulfur-containing gas (e.g., $SO_2$ or COS). In embodiments in which the pre-etch step of stage 302c is a plasma etch step, the plasma etch of pre-etch step of stage 302c might or might not be performed in a plasma process chamber of a same plasma system used for cyclic etch process 325, to the extent cyclic etch process 325 is a plasma process.

The etch process used in the pre-etch step of stage 302c may be an anisotropic etch process, according to particular implementation objectives, which may etch in a particular direction, such as a downward direction in to begin forming recesses 126 in underlying layer 114.

Process 300 proceeds to cyclic etch process 325. In the embodiment illustrated in FIG. 3B, cyclic etch process 325 includes two primary steps. A first step, as shown stage 302d, is a deposition step in which protective layer 250 is deposited over at least a portion of underlying layer 114, and a second step, as shown at stage 302e, is an etching step in which a portion of underlying layer 114 is etched using patterned layer 124' as an etch mask.

In general, aspects of stage 302d (the deposition step in which protective layer 250 is deposited over at least a portion of underlying layer 114) correspond to aspects of stage 202d, and for simplicity are not repeated. Thus, the description of stage 202d is incorporated by reference into the description of stage 302d (with appropriate substitution of references to cyclic etch process 325 and its associated stages for references to cyclic etch processes 225 and its associated stages), including without limitation the content of protective layer 250, techniques for depositing protective layer 250, potential thicknesses of protective layer 250, and associated advantages of using protective layer 250.

Furthermore, in general, aspects of stage 302e (the etching step in which a portion of underlying layer 114 is etched using patterned layer 124' as an etch mask) correspond to aspects of stage 202c, and for simplicity are not repeated. Thus, the description of stage 202c is incorporated by reference into the description of stage 302e, including without limitation techniques for etching a portion of underlying layer 114 using patterned layer 124' as an etch mask. Regarding stage 302e of cyclic etch process 325, and in contrast to stage 202c of cyclic etch process 225, because in process 300 a pre-etch was performed (at stage 302c), the formation of recesses 126 in underlying layer 114 has already begun. In one or more subsequent etches at stage 302e, recesses 126 are further extended into underlying layer 114 until top surface 128 of underlying layer 112 is exposed at the bottom of recesses 126 (see stage 302f).

As shown by arrows 264, the steps of cyclic etch process 325 may be repeated one or more times to gradually form recesses 126 in underlying layer 114. Cyclic etch process 325 may be performed any suitable number times.

As with cyclic etch process 225, in certain embodiments, each cycle through cyclic etch process 325 is capable of further extending recesses 126 into underlying layer 114. The appropriate number of cycles for performing cyclic etch process 325 for a given implementation depends on various factors and may be determined in various ways, including those factors and ways described above in connection with cyclic etch process 225 (with appropriate substitution of references to cyclic etch process 325 for references to cyclic etch process 225). Furthermore, techniques for testing and modifying process conditions may be similar to those described above in connection with cyclic etch process 225.

Turning to the process conditions and associated parameters for the protective-layer deposition step of stage 302d and the etch step of stage 302e, in an example, both the protective-layer deposition step and the etch step may be performed using plasma processes. In certain embodiments, the steps of cyclic etch process 325 may be executed in a same plasma process chamber of a plasma system (e.g., an ICP tool). Additionally, similar considerations and options regarding whether and when to perform a purge of the gases within the plasma process chamber between the steps of cyclic etch process 225 also apply to the cyclic etch process 325.

The pre-etch performed at stage 302c might or might not be performed in the same plasma process chamber of a plasma system as one or more of the steps of cyclic etch process 325. Additionally, assuming for example that the pre-etch of stage 302c is performed in a same plasma process chamber of a plasma system as the process chamber in which the deposition step of cyclic etch process 350 is performed (e.g., at stage 302d), a purge of the plasma process chamber might or might not be performed after the pre-etch of stage 302c.

Example process conditions and associated parameters to be considered for cyclic etch process 325, as well as the manner of selecting and optimizing those process conditions and associated parameters, are generally similar to those described above with reference to cyclic etch process 225 (with appropriate substitution of references to cyclic etch process 325 and its associated stages for references to cyclic etch processes 225 and its associated stages), and are not repeated. The description of example process conditions of stage 202c (the etch step of process 200) and of stage 202d (the protective layer deposition step of process 200) are incorporated by reference as to stage 302e (the etch step of process 300) and stage 302d (the protective layer deposition step of process 300), respectively.

Additionally, first and second particular example embodiments of process conditions and associated parameters were described above with reference to the etch step (stage 202c) and protective layer deposition step (stage 202d) of cyclic etch process 225 of FIG. 2B. In certain embodiments, those same first and second particular example embodiments of process conditions and associated parameters may be applied for the protective layer deposition step (stage 302d) and the etch step (stage 302e) of cyclic etch process 325 (with appropriate substitution of references to cyclic etch process 325 and its associated stages for references to cyclic etch processes 225 and its associated stages), and are not repeated.

In certain embodiments, and depending on various process conditions, for reasons similar to those discussed above with reference to performing an etch step at stage 202c before a protective-layer deposition step at stage 202d, performing a pre-etch step (e.g., stage 302c) before a protective-layer deposition step (e.g., stage 302d), as is done in process 300, may reduce a number of times protective layer 250 is deposited by at least one relative to other examples of cyclic etch processes in which protective layer 250 is deposited prior to any etch of underlying layer 114.

Stages 302f and 302g of process 300 (shown in FIG. 3C) generally correspond to aspects of stages 202e and 202f, and for simplicity are not repeated. Thus, the descriptions of stages 202e and 202f are incorporated by reference as the descriptions of stages 302f and 302g, respectively, (with appropriate substitution of references to stages 302f and 302g for references to stages 202e and 202f, respectively), including without limitation the content of semiconductor device 204 at stages 202e and 202f, the techniques associated with stages 202e and 202f, and any attendant potential advantages at stages 202e and 202f.

Figure 4A:
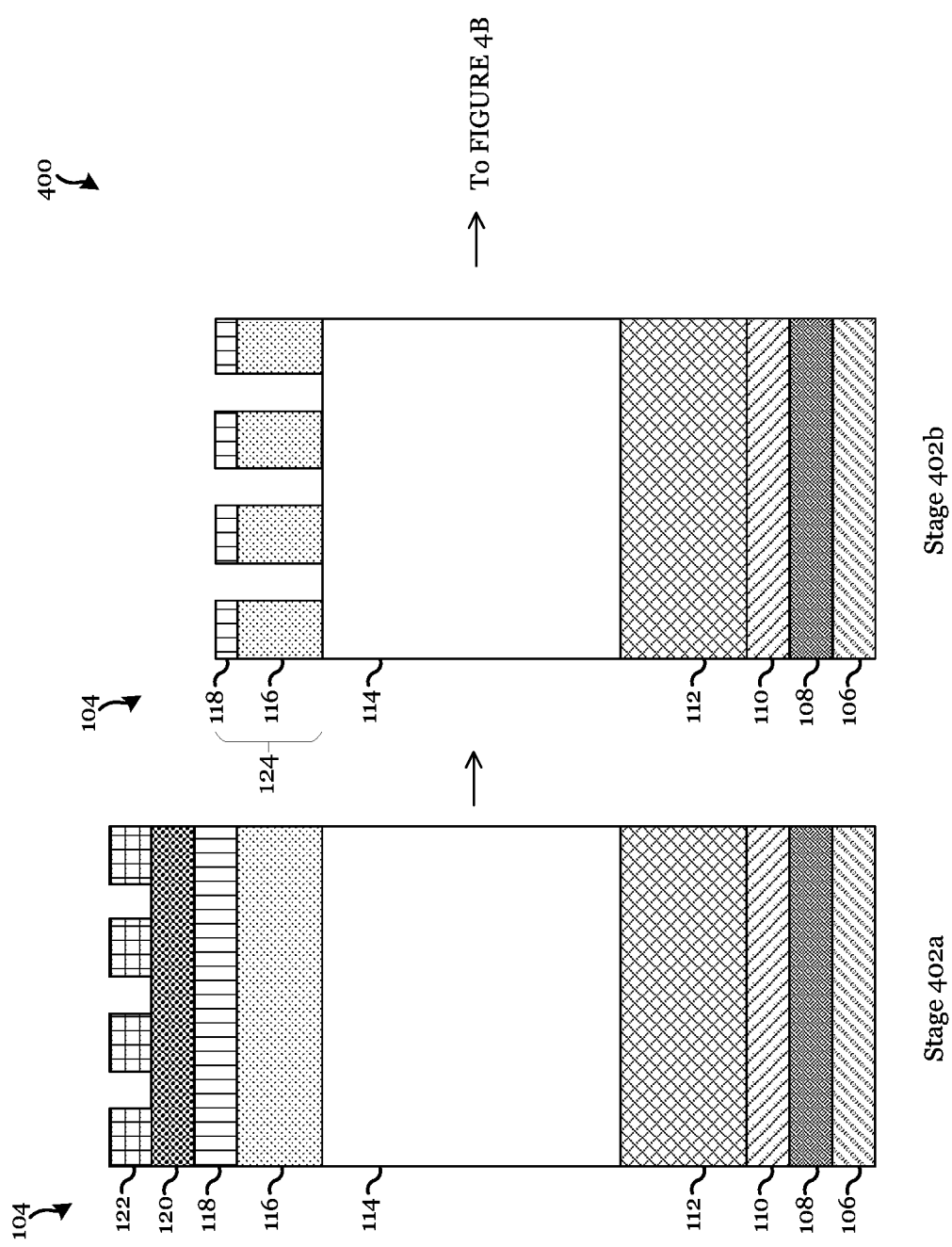
FIGS. 4A-4C illustrate cross-sectional views of a semiconductor device during a process for forming the semiconductor device, according to certain embodiments of this disclosure.
Figure 4B:
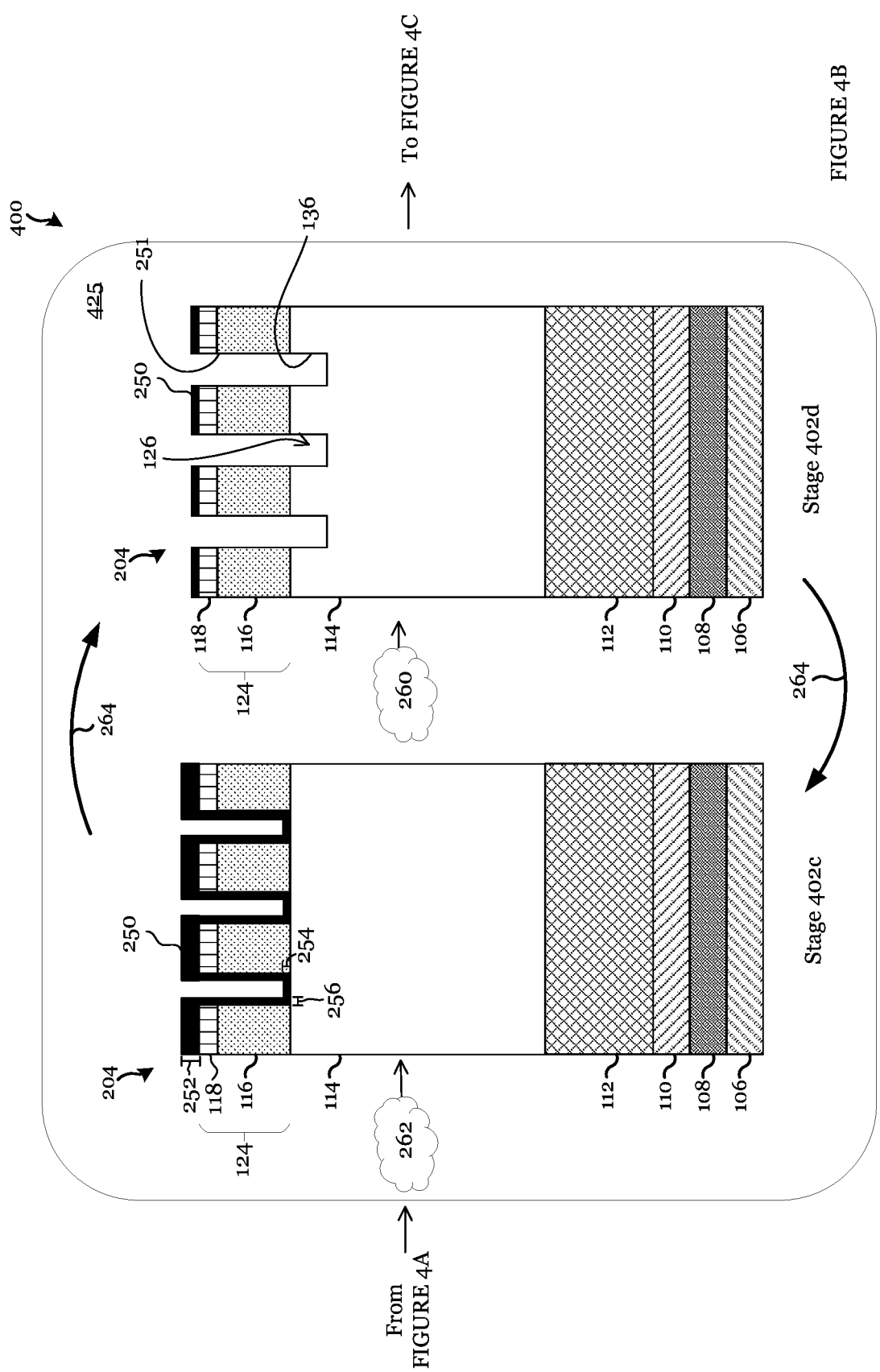
Figure 4C:
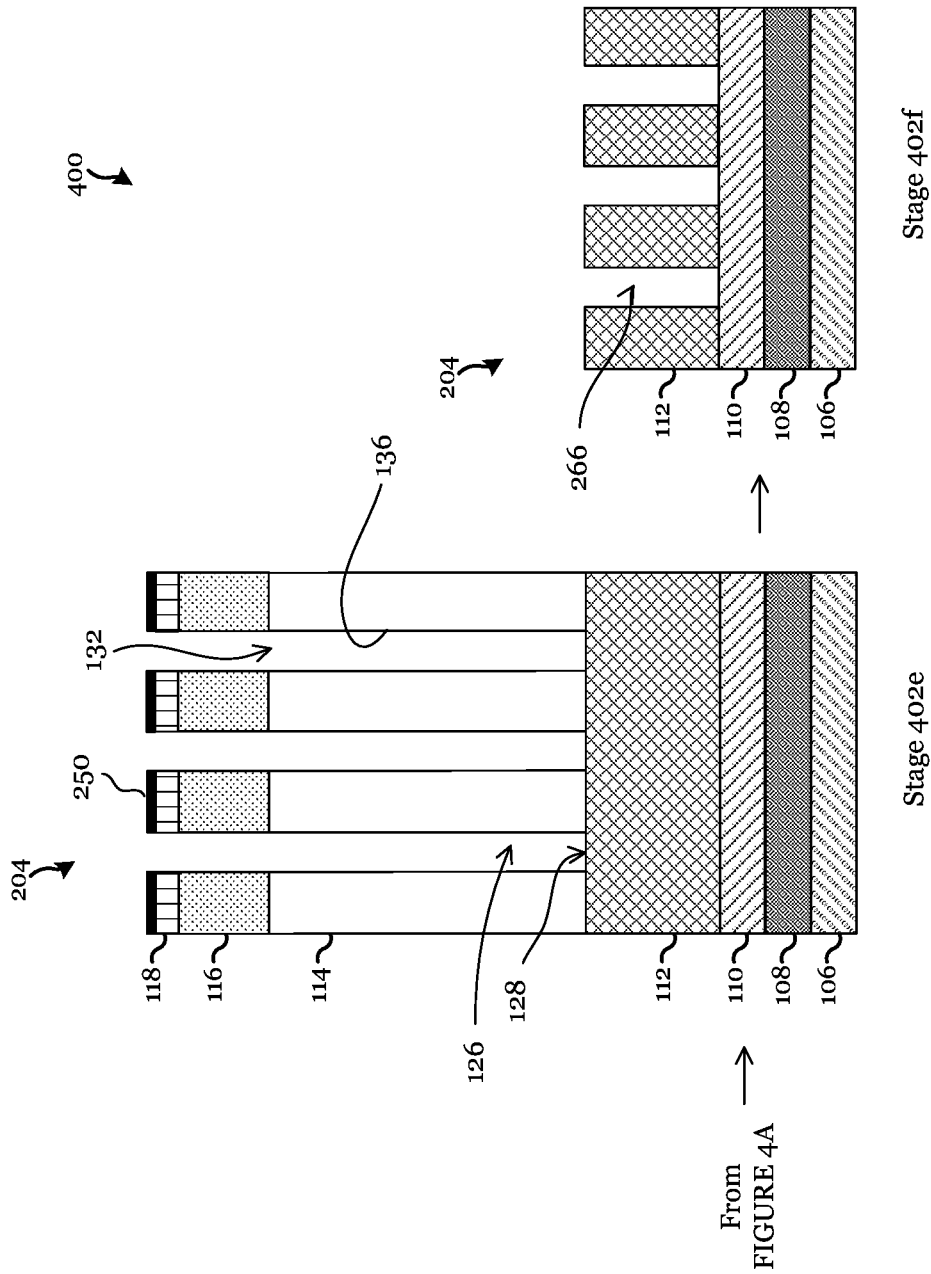

FIGS. 4A-4C illustrate cross-sectional views of semiconductor device 204 during a process 400 for forming semiconductor device 204, according to certain embodiments of this disclosure. Process 400 is analogous to process 200 of FIGS. 2A-2C in many respects; however, as described in greater detail below, in a cyclic etch process 425 of process 400, an order of a protective-layer deposition step and an etch step are reversed relative to the analogous steps in cyclic etch process 225 of process 200.

Process 400 includes stages 402a-402f. In this example, certain aspects of process 400 may correspond to aspects of process 100 and/or process 200 and/or process 300 described above with reference to FIGS. 1, 2A-2C, and 3A-3C and are not repeated. For example, stages 402a and 402b of process 400 generally correspond to stages 302a and 302b of process 300, respectively, to stages 202a and 202b of process 200, respectively, and to stages 102a and 102b of process 100, respectively. As another example, at stage 402a (as was the case at stage 202a and 302a), semiconductor device 204 includes substrate 106, intermediate layer 108, intermediate layer 110, underlying layer 112, underlying layer 114, intermediate layer 116, intermediate layer 118, intermediate layer 120, and patterned layer 122, each of which may include the same materials as and include other shared features with the like-numbered layer of semiconductor device 104.

Turning to the stages that follow stage 402b, in contrast to a typical plasma (or other) etch process that simply etches a layer to be etched (e.g., underlying layer 114) until a surface of a further underlying layer (e.g., surface 128 of underlying layer 112) is exposed (e.g., as shown at stage 102c), process 400 includes a cyclic etch process 425 to pattern an underlying layer (e.g., underlying layer 114) using a patterned layer 124 as an etch mask, and cyclic etch process 425 includes forming a protective layer 250 at least on portions of a layer to be etched (e.g., underlying layer 114) and etching the layer to be etched.

In the embodiment illustrated in FIG. 4B, cyclic etch process 425 includes two primary steps. A first step, as shown stage 402c, is a deposition step in which protective layer 250 is deposited over at least a portion of underlying layer 114, and a second step, as shown at stage 402d, is an etch step in which a portion of underlying layer 114 is etched using patterned layer 124 as an etch mask.

In general, aspects of stage 402c (the deposition step in which protective layer 250 is deposited over at least a portion of underlying layer 114) correspond to aspects of stages 202d and 302d, and for simplicity are not repeated. Thus, the descriptions of stages 202d and 302d are incorporated by reference into the description of stage 302d (with appropriate substitution of references to cyclic etch process 425 and its associated stages for references to cyclic etch processes 225 and 325 and their associated stages), including without limitation the content of protective layer 250, techniques for depositing protective layer 250, potential thicknesses of protective layer 250, and associated advantages of using protective layer 250.

Furthermore, in general, aspects of stage 402d (the etching step in which a portion of underlying layer 114 is etched using patterned layer 124 as an etch mask) correspond to aspects of stages 202c and 302e, and for simplicity are not repeated. Thus, the descriptions of stages 202c and 302e are incorporated by reference into the description of stage 402d, including without limitation techniques for etching a portion of underlying layer 114 using patterned layer 124 as an etch mask. In the example of FIG. 4B and in contrast to FIGS. 2B and 3B, patterned layer 124 remains patterned layer 124, at least a portion of layer 118 remaining on layer 116 during cyclic etch process 425. Thus, in the illustrated example at stage 402c, protective layer 250 is deposited on a top surface of patterned layer 124. This is just an example, and patterned layer in process 400 may be removed (e.g., at stage 402b) such that patterned layer 124 becomes patterned layer 124'.

As shown by arrows 264, the steps of cyclic etch process 425 may be repeated one or more times to gradually form recesses 126 in underlying layer 114. Cyclic etch process 425 may be performed any suitable number times.

As with cyclic etch processes 225 and 325, in certain embodiments, each cycle through cyclic etch process 425 is capable of further extending recesses 126 into underlying layer 114. The appropriate number of cycles for performing cyclic etch process 425 for a given implementation depends on various factors and may be determined in various ways, including those factors and ways described above in connection with cyclic etch processes 225 and 325 (with appropriate substitution of references to cyclic etch process 425 and its associated stages for references to cyclic etch processes 225 and 325 and their associated stages). Furthermore, techniques for testing and modifying process conditions may be similar to those described above in connection with cyclic etch processes 225 and 325.

Turning to the process conditions and associated parameters for the protective-layer deposition step of stage 402c and the etch step of stage 402d, in an example, both the protective-layer deposition step and the etch step may be performed using plasma processes. In certain embodiments, the steps of cyclic etch process 425 may be executed in a same plasma process chamber of a plasma system (e.g., an ICP tool). Additionally, similar considerations and options regarding whether and when to perform a purge of the gases within the plasma process chamber between the steps of cyclic etch process 225 also apply to cyclic etch process 425.

Example process conditions and associated parameters to be considered for cyclic etch process 425, as well as the manner of selecting and optimizing those process conditions and associated parameters, are generally similar to those described above with reference to cyclic etch processes 225 and 325 (with appropriate substitution of references to cyclic etch process 425 and its associated stages for references to cyclic etch processes 225 and 325 and their associated stages), and are not repeated. The description of example process conditions of stage 202c (the etch step of process 200) and of stage 202d (the protective layer deposition step of process 200) are incorporated by reference as to stage 402d (the etch step of process 400) and stage 402c (the protective layer deposition step of process 400), respectively.

Additionally, first and second particular example embodiments of process conditions and associated parameters were described above with reference to the etch step (stage 202c) and protective layer deposition step (stage 202d) of cyclic etch process 225 of FIG. 2B. In certain embodiments, those same first and second particular example embodiments of process conditions and associated parameters may be applied for the protective layer deposition step (stage 402c) and the etch step (stage 402d) of cyclic etch process 425 (with appropriate substitution of references to cyclic etch process 425 and its associated stages for references to cyclic etch processes 225 and its associated stages), and are not repeated.

In certain embodiments, and depending on various process conditions, depositing protective layer 250 (e.g., stage 402c) prior to performing any etch of underlying layer 114 (e.g., stage 402d), as is done in cyclic etch process 425, may provide enhanced protection from forming pattern defects in underlying layer 114, such as pattern defects in the vertical profile of sidewalls 136 of underlying layer 114 in recesses 126. Additionally or alternatively, in certain embodiments, and depending on various process conditions, depositing protective layer 250 (e.g., stage 402c) prior to performing any etch of underlying layer 114 (e.g., stage 402d), as is done in cyclic etch process 425, may provide enhanced protection from unintended erosion of patterned layer 124 or protrusion of patterned layer 124 into openings of recesses 126. Although the pattern defects that can result from etching underlying layer 114 without protective layer 250 may be minimal when the etch process is short relative to the prolonged etch process to fully etch recesses in underlying layer 114, depositing protective layer 250 prior to performing any etch of underlying layer 114 may provide enhanced protection from formation of pattern defects in sidewalls 160 of underlying 114 and erosion of corner regions of patterned layer 124/124'.

Stages 402e and 402f of process 400 (shown in FIG. 4C) generally correspond to aspects of stages 202e and 202f, respectively, and to stages 302f and 302g, respectively, and for simplicity are not repeated. Thus, the descriptions of stages 202e and 202f are incorporated by reference as the descriptions of stages 402e and 402f, respectively, (with appropriate substitution of references to stages 402e and 402f for references to stages 202e and 202f, respectively), including without limitation the content of semiconductor device 204 at stages 202e and 202f, the techniques associated with stages 202e and 202f, and any attendant potential advantages at stages 202e and 202f.

Although throughout FIGS. 2A-2C, 3A-3C, and 4A-4C (and other portions of this disclosure) semiconductor device 204 is shown and described as having particular layers of particular materials, semiconductor device 204 may have different combinations of the same and/or other materials and/or layers. Furthermore, although semiconductor device 204 is shown and described as having a particular number of layers, semiconductor device 204 may have any suitable number of layers.

Additionally, although processes 200, 300, and 400 are shown as including particular stages, processes 200, 300, and 400 may include additional or fewer stages as might be appropriate for a particular implementation. For example, process 200 might include purge stages between stages 202c and 202d and between stages 202d and a return to 202c; process 300 might include purge stages between stages 302d and 302e and between stages 302e and a return to 302d; and/or process 400 might include purge stages between stages 402c and 402d and between stages 402d and a return to 402c.

Furthermore, although this disclosure primarily describes using plasma processes for the etch steps of processes 200, 300, and 400 (e.g., stages 202c, 302c, 302e, and 402d), and for the protective-layer deposition steps of processes 200, 300, and 400 (e.g., stages 202d, 302d, and 402c), the steps of processes 200, 300, and 400, including the steps of cyclic etch processes 225, 325, and 425, may be any combination of dry and wet processes.

Figure 5:
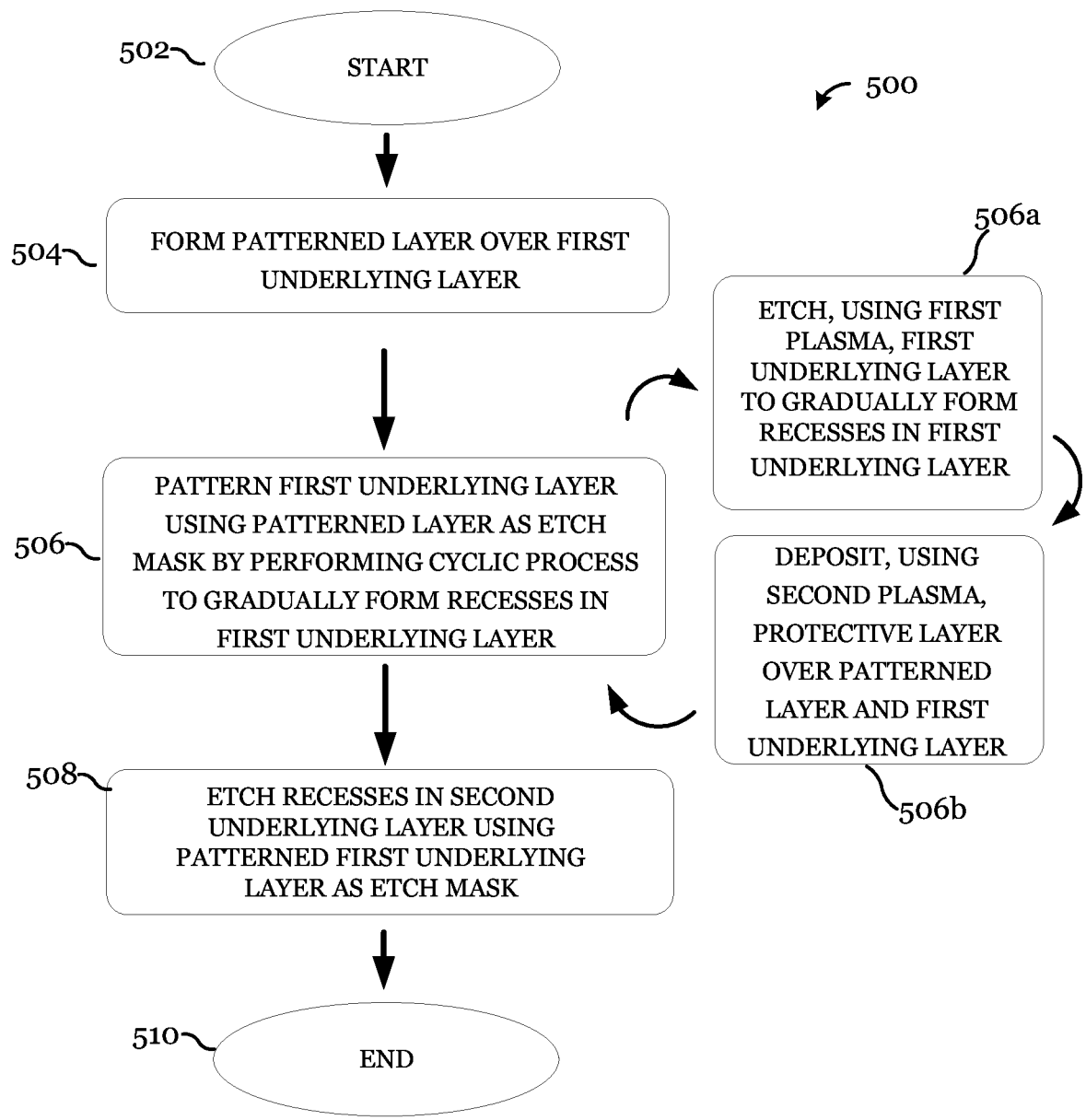
FIG. 5 illustrates an example method for forming a semiconductor device, according to certain embodiments of this disclosure.

FIG. 5 illustrates an example method 500 for forming a semiconductor device 204, according to certain embodiments of this disclosure.

The method begins at step 502. At step 504, patterned layer 124 is formed over underlying layer 114, using patterned layer 122 as an etch mask for example. Forming patterned layer 124 may include performing a plasma etch (or other suitable etch process) to remove patterned layer 122 and, if applicable, one or more intervening layers (e.g., intermediate layers 118 and 120) between patterned layer 122 and underlying layer 114 (e.g., an ACL).

At step 506, underlying layer 114 is patterned using patterned layer 124 as an etch mask by performing a cyclic process (e.g., cyclic etch process 225). In certain embodiments, the cyclic process includes etching, at step 506a, using a plasma 260, underlying layer 114 to gradually form recesses 126 in underlying layer 114 and, at step 506b, depositing, using plasma 262, protective layer 250 over patterned layer 124 and underlying layer 114.

The cyclic process can be repeated a suitable number of times to gradually form recesses 126 in underlying layer 114. Furthermore, the cyclic nature of the cyclic process, coupled with the deposition of protective layer 250, facilitates reducing formation of pattern defects in underlying layer 114 and an undesirable erosion of patterned layer 124 over underlying layer 114. For example, the cyclic process may be performed a predetermined number of times. As another example, the cyclic process may be performed until top surface 128 is exposed at the bottom of recesses 126 in underlying layer 114. In certain embodiments, a final "cycle" through step 506 (e.g., cyclic etch process 225) stops after an instance of the etch step of step 506a such that the last cycle of step 506 is not a complete cycle.

After the first step of the cyclic etch process (e.g., cyclic etch process 225) of method 500 (step 506a) and prior to the second step of the cyclic etch process (e.g., cyclic etch process 225) (step 506b), a plasma process chamber in which steps 506a and 506b may be performed might or might not be purged to remove remaining gases or other materials associated with the etching step of step 506a.

At step 508, recesses 266 are etched in underlying layer 112 using patterned underlying layer 114 as an etch mask. Underlying layer 112 may be etched using any suitable process, such as a dry etch process (e.g., a plasma etch process), a wet etch process, or any other suitable technique. Etching of recesses 126 (at step 506a) and recesses 266 (at step 508) may be performed in the same etch tool or in different etch tools (e.g., in the same plasma process tool or in different plasma process tools). In one example, the cyclic process of step 506 is performed a suitable number of times in a first tool (e.g., a first plasma process tool), and then semiconductor device 204 is moved to a different second tool (e.g., a different second plasma process tool) to perform step 508.

Underlying layer 114 serves as an etch mask for etching underlying layer 112, such that recesses 266 are formed in underlying layer 112 that correspond to recess 126 of underlying layer 114. The potentially improved vertical profile of recesses 126 of underlying layer 114 may facilitate improving the vertical profile of recesses 266 formed from etching, using underlying layer 114 as an etch mask.

At step 510, method 500 ends.

Figure 6:
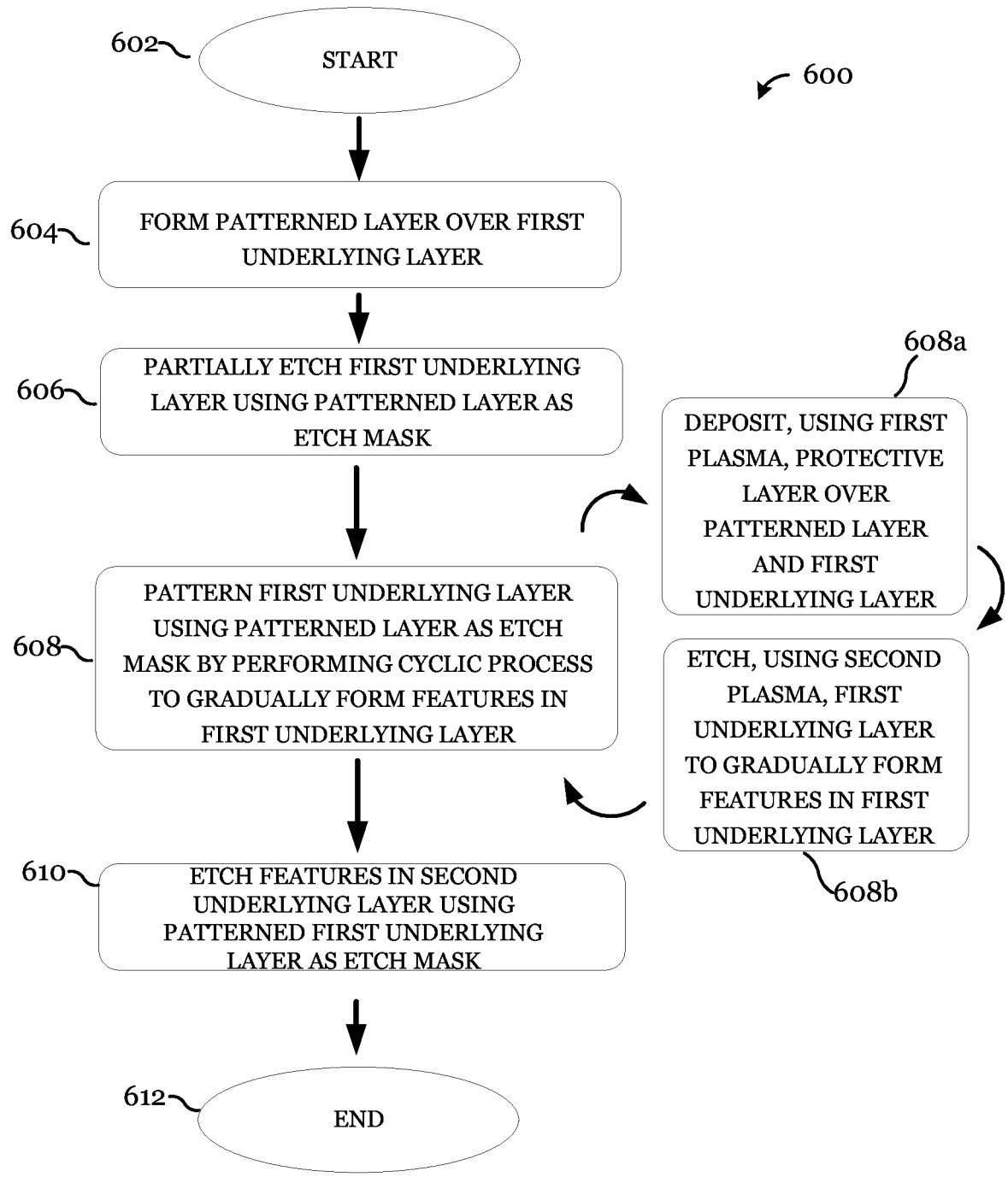
FIG. 6 illustrates an example method for forming a semiconductor device, according to certain embodiments of this disclosure.

FIG. 6 illustrates an example method 600 for forming a semiconductor device 204, according to certain embodiments of this disclosure.

The method begins at step 602. At step 604, patterned layer 124 is formed over underlying layer 114, using patterned layer 122 as an etch mask for example. In certain embodiments, forming patterned layer 124 includes performing a plasma etch (or other suitable etch process) to remove patterned layer 122 and, if applicable, one or more intervening layers (e.g., intermediate layers 118 and 120) between patterned layer 122 and underlying layer 114 (e.g., an ACL).

At step 606, a partial etch of underlying layer 114 is performed using patterned layer 124 as an etch mask. The partial etch of underlying layer 114 performed at step 606 may form initial portions of recesses 126 in underlying layer 114. Step 606 may be referred to as a pre-etch of underlying layer 114 prior to beginning a cyclic process for forming recesses 126 in underlying layer 114. In certain embodiments, the pre-etch of step 606 may remove portions of patterned layer 124 such that patterned layer 124 becomes patterned layer 124'.

At step 608, underlying layer 114 is patterned using patterned layer 124' as an etch mask by performing a cyclic process (e.g., cyclic etch process 325). In certain embodiments, the cyclic process includes, at step 608a, depositing, using plasma 262, protective layer 250 over patterned layer 124' and underlying layer 114, and etching, at step 508b, using a plasma 260, underlying layer 114 to gradually form recesses 126 in underlying layer 114.

The cyclic process can be repeated a suitable number of times to gradually form recesses 126 in underlying layer 114. Furthermore, the cyclic nature of the cyclic process, coupled with the deposition of protective layer 250, facilitates reducing formation of pattern defects in underlying layer 114 and an undesirable erosion of intermediate layer 116 over underlying layer 114. For example, the cyclic process may be performed a predetermined number of times. As another example, the cyclic process may be performed until top surface 128 is exposed at the bottom of recesses 126 in underlying layer 114.

After the first step of the cyclic etch process (e.g., cyclic etch process 325) of method 600 (step 608a) and prior to the second step of the cyclic etch process (e.g., cyclic etch process 325) (step 608b), the plasma process chamber might or might not be purged to remove remaining gases or other materials associated with the etching step.

At step 610, recesses 266 are etched in underlying layer 112 using patterned underlying layer 114 as an etch mask. Underlying layer 112 may be etched using any suitable process, such as a dry etch process (e.g., a plasma etch process), a wet etch process, or any other suitable technique. Etching of recesses 126 (at step 608b) and recesses 266 (at step 610) may be performed in the same etch tool or in different etch tools (e.g., in the same plasma process tool or in different plasma process tools). In one example, the cyclic process of step 608 is performed a suitable number of times in a first tool (e.g., a first plasma process tool), and then semiconductor device 204 is moved to a different second tool (e.g., a different second plasma process tool) to perform step 610.

Underlying layer 114 serves as an etch mask for etching underlying layer 112, such that recesses 266 are formed in underlying layer 112 that correspond to recess 126 of underlying layer 114. The potentially improved vertical profile of recesses 126 of underlying layer 114 may facilitate improving the vertical profile of recesses 266 formed from etching, using underlying layer 114 as an etch mask.

At step 612, method 600 ends.

Figure 7:
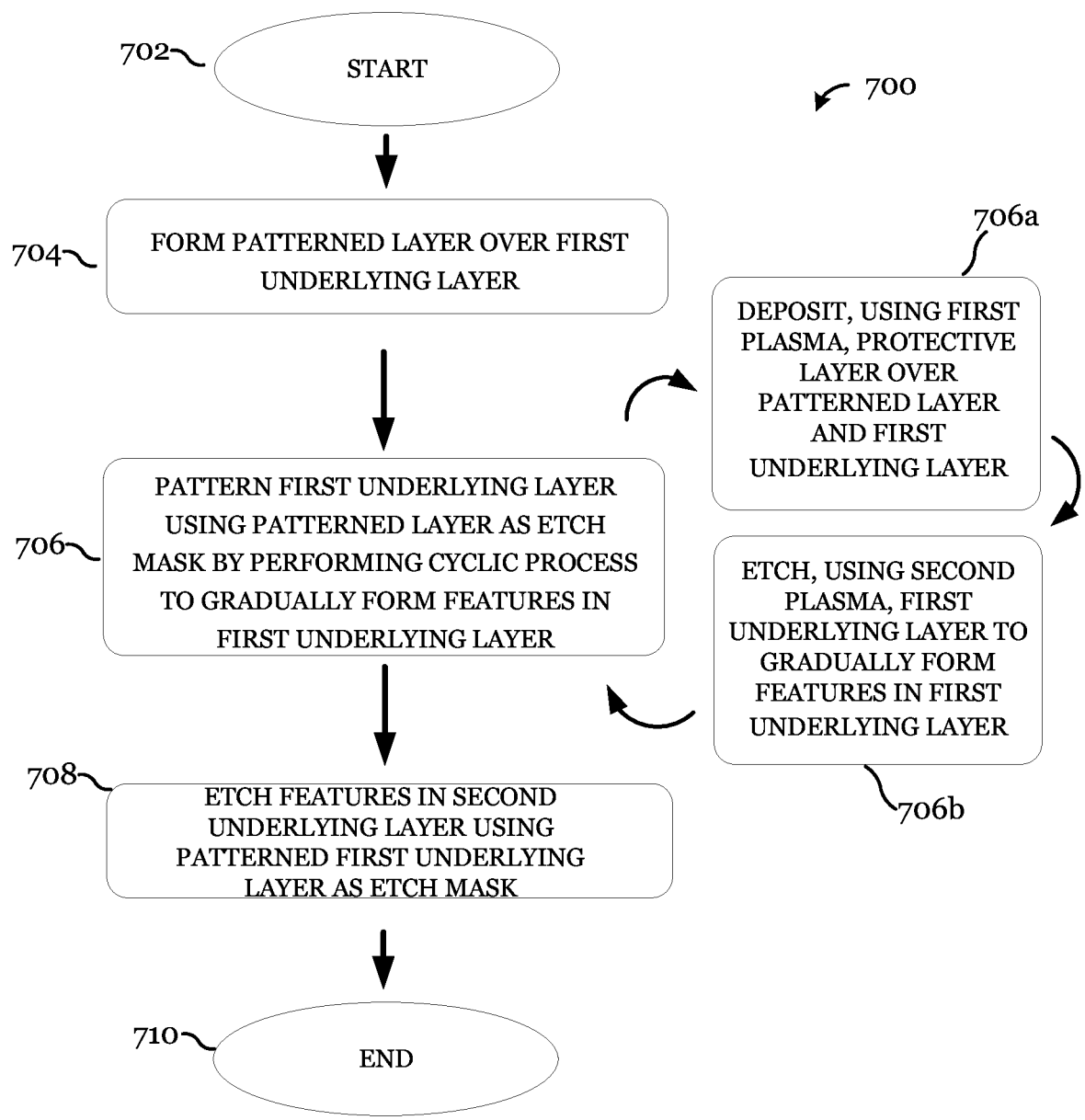
FIG. 7 illustrates an example method for forming a semiconductor device, according to certain embodiments of this disclosure.

FIG. 7 illustrates an example method 700 for forming a semiconductor device 204, according to certain embodiments of this disclosure.

The method begins at step 702. At step 704, patterned layer 124 is formed over underlying layer 114, using patterned layer 122 as an etch mask for example. In certain embodiments, forming patterned layer 124 includes performing a plasma etch (or other suitable etch process) to remove patterned layer 122 and, if applicable, one or more intervening layers (e.g., intermediate layers 118 and 120) between patterned layer 122 and underlying layer 114 (e.g., an ACL).

At step 706, underlying layer 114 is patterned using patterned layer 124 as an etch mask by performing a cyclic process (e.g., cyclic etch process 425). In certain embodiments, the cyclic process includes depositing, at step 706a using plasma 262, protective layer 250 over patterned layer 124 and underlying layer 114, and etching, at step 706b, using a plasma 260, underlying layer 114 to gradually form recesses 126 in underlying layer 114.

The cyclic process can be repeated a suitable number of times to achieve gradually form recesses 126 in underlying layer 114. Furthermore, the cyclic nature of the cyclic process, coupled with the deposition of protective layer 250, facilitates reducing formation of pattern defects in underlying layer 114 and an undesirable erosion of intermediate layer 116 over underlying layer 114. For example, the cyclic process may be performed a predetermined number of times. As another example, the cyclic process may be performed until top surface 128 is exposed at the bottom of recesses 126 in underlying layer 114.

After the first step of the cyclic etch process (e.g., cyclic etch process 425) of method 700 (step 706a) and prior to the second step of the cyclic etch process (e.g., cyclic etch process 425) (step 706b), the plasma process chamber might or might not be purged to remove remaining gases or other materials associated with the deposition step.

At step 708, recesses 266 are etched in underlying layer 112 using patterned underlying layer 114 as an etch mask. Underlying layer 112 may be etched using any suitable process, such as a dry etch process (e.g., a plasma etch process), a wet etch process, or any other suitable technique. Etching of recesses 126 (at step 706b) and recesses 266 (at step 708) may be performed in the same etch tool or in different etch tools (e.g., in the same plasma process tool or in different plasma process tools). In one example, the cyclic process of step 706 is performed a suitable number of times in a first tool (e.g., a first plasma process tool), and then semiconductor device 204 is moved to a different second tool (e.g., a different second plasma process tool) to perform step 708.

Underlying layer 114 serves as an etch mask for etching underlying layer 112, such that recesses 266 are formed in underlying layer 112 that correspond to recess 126 of underlying layer 114. The potentially improved vertical profile of recesses 126 of underlying layer 114 may facilitate improving the vertical profile of recesses 266 formed from etching, using underlying layer 114 as an etch mask.

At step 710, method 700 ends.

Figure 8:
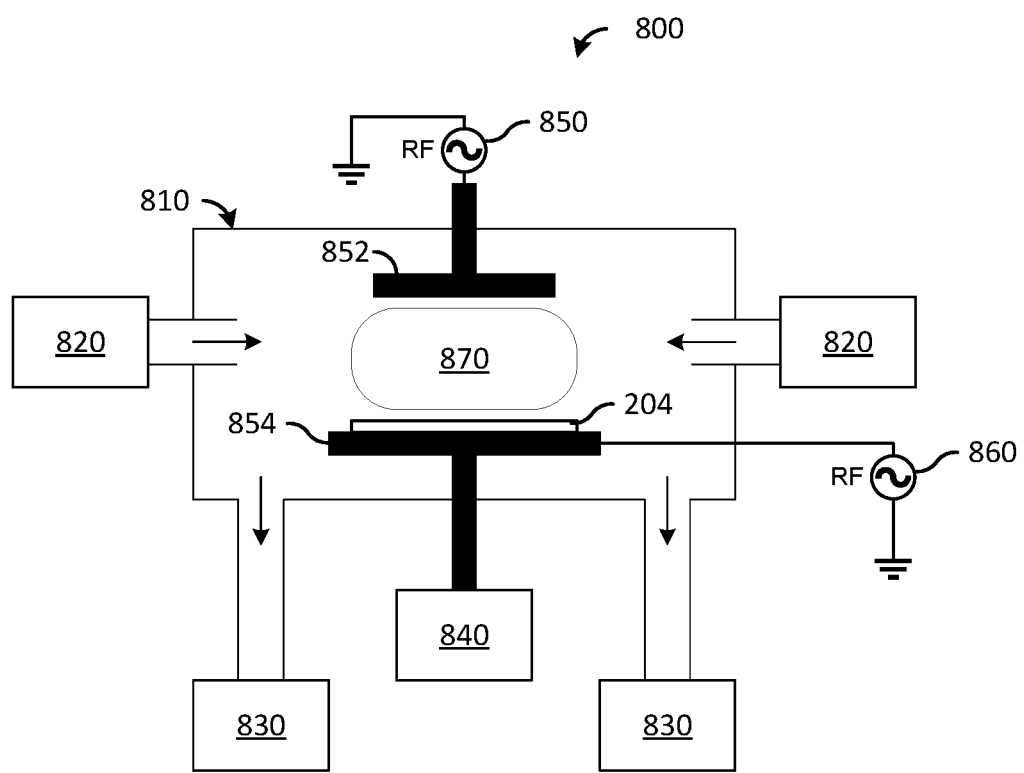
FIG. 8 illustrates a general schematic of an example plasma system, according to certain embodiments of this disclosure.

FIG. 8 illustrates a general schematic of an example plasma system 800, according to certain embodiments of this disclosure. Although a particular example plasma system 800 is illustrated and described, this disclosure contemplates using any suitable type of plasma system 800. Plasma system 800 may be used to perform some or all of the plasma process steps.

Plasma system 800 includes plasma process chamber 810, gas delivery system 820, vacuum exhaust system 830, temperature controller 840, and power sources 850 and 860. Plasma process chamber 810 includes electrode 852 and substrate holder 854.

Some or all of the steps described with respect to FIGS. 1-7 may be performed using plasma system 800, with semiconductor device 204 being position on substrate holder 854 of plasma process chamber 810. For example, to the extent a plasma process is used to etch underlying layer 114 using patterned layer 124 as an etch mask or to form a protective layer 250, semiconductor device 204 may be positioned in plasma process chamber 810 and exposed to a suitable plasma 870, which depending on the stage of processing could be plasma 260 or 262 for example. As another example, to the extent a plasma process is used for one or both of the first and second steps of cyclic etch process (e.g., one or more of cyclic etch processes 225, 325, or 425), semiconductor device 204 may be positioned (or remain) in plasma process chamber 810 and exposed to one or more suitable plasmas 870.

Gas delivery system 820, vacuum exhaust system 830, temperature controller 840, power sources 850 and 860, and electrode 852 may be programmed or otherwise operated according to desired process conditions for a given processing step. For example, to the extent a plasma process is used to deposit protective layer 250, these components of plasma system 800 may be set according to the example process conditions and associated parameters described in connection with depositing protective layer 250. As another example, to the extent a plasma process is used to etch recesses 126 in underlying layer 114, these components of plasma system 800 may be set according to the example process conditions and associated parameters described in connection with etching recesses 126 in underlying layer 114.

Although this disclosure describes particular process steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of forming a semiconductor device, the method comprising:
    forming a patterned layer over an amorphous carbon layer (ACL) to be etched, the ACL disposed over a substrate; and
    patterning the ACL using the patterned layer as an etch mask, by performing an initial cycle and one or more subsequent cycles of a cyclic process to gradually form a recess in the ACL, wherein the initial cycle and the one or more subsequent cycles each comprise:
        depositing, using a first plasma, a protective layer containing silicon over the patterned layer and one or more exposed surfaces of the ACL, the first plasma comprising a silicon-based precursor and a carrier gas; and
        etching, using a second plasma, an incremental portion of the recess in the ACL, the second plasma containing oxygen,
    wherein:
        the incremental portion of the initial cycle is an initial portion of the recess being gradually formed in the ACL such that the protective layer is deposited in the initial cycle prior to etching the initial portion of the recess in the ACL, the incremental portion of each of the one or more subsequent cycles further extending the recess being gradually formed in the ACL,
        during the initial cycle and the one or more subsequent cycles, the protective layer is deposited over a top surface of the patterned layer and along a top surface of the ACL exposed by the patterned layer, and
        during the one or more subsequent cycles, the protective layer is further deposited along sidewall surfaces of the ACL in the recess being gradually formed in the ACL and exposed by the patterned layer.

2. The method of claim 1, wherein, for the initial cycle of the cyclic process, depositing the protective layer forms the protective layer to a first thickness over the top surface of the patterned layer and to a second thickness along the top surface of the ACL exposed by the patterned layer, the first thickness being greater than the second thickness.

3. The method of claim 1, wherein, for a first subsequent cycle of the one or more subsequent cycles of the cyclic process, depositing the protective layer further forms the protective layer to:
    a first thickness over the top surface of the patterned layer,
    a second thickness along the top surface of the ACL exposed by the patterned layer, the first thickness being greater than the second thickness, and
    a third thickness along the sidewall surfaces of the ACL in the recess being gradually formed in the ACL and exposed by the patterned layer.

4. The method of claim 1, wherein the patterned layer comprises at least one of silicon nitride, silicon oxide (SiO2), silicon oxynitride (SiON), a silicon-containing anti-reflective coating, or an organic material.

5. The method of claim 1, wherein:
the silicon-based precursor of the first plasma is silicon tetrachloride (SiCl4) or silicon tetrafluoride (SiF4); and
the carrier gas comprises at least one of helium (He), nitrogen (N2), hydrogen (H2), or argon (Ar).

6. The method of claim 1, wherein the second plasma further comprises a sulfur-containing gas.

7. The method of claim 1, wherein:
a depth of the recess is increased with each cycle of the cyclic process; and
a depth of the recess formed by the cyclic process is greater than a width of the recess.

8. The method of claim 1, wherein, in association with each of the initial cycle and the one or more subsequent cycles, as a result of etching the incremental portion of the recess in the ACL:
the protective layer over the top surface of the patterned layer is partially etched; and
the protective layer along the top surface of the ACL exposed by the patterned layer is etched through to facilitate extending the recess in the ACL.

9. A method of forming a semiconductor device, the method comprising:
positioning a semiconductor wafer in a plasma process chamber, the semiconductor wafer comprising a patterned layer positioned over an underlying layer to be etched, the underlying layer comprising an amorphous carbon layer formed over a dielectric layer disposed on a substrate; and
performing an initial cycle and one or more subsequent cycles of a cyclic plasma etch process in the plasma process chamber to gradually form recesses in the underlying layer until the dielectric layer is exposed, the initial cycle and the one or more subsequent cycles of the cyclic plasma etch process each comprising:
introducing, in a protective layer deposition step, a first processing gas into the plasma process chamber such that a protective layer is deposited over the patterned layer and along exposed surfaces of the underlying layer, the first processing gas comprising a silicon-based precursor and a carrier gas, the protective layer containing silicon; and
subsequent to the protective layer deposition step, introducing, in an etch step, a second processing gas into the plasma process chamber such that the recesses are gradually etched in the underlying layer according to the patterned layer, the second processing gas being oxygen based,
wherein the etch step of the initial cycle is an initial etch of the underlying layer and forms initial portions of the recesses in the underlying layer and each subsequent cycle of the one or more subsequent cycles extends the recesses in the underlying layer, and
wherein the method comprises, during each of the initial cycle and the one or more subsequent cycles of the cyclic plasma etch process, executing a purge of the plasma process chamber between the protective layer deposition step and the etch step.

10. The method of claim 9, wherein introducing the first processing gas into the plasma process chamber to deposit the protective layer forms the protective layer to a first thickness over top surfaces of the patterned layer and to a second thickness along top surfaces of the underlying layer exposed by the patterned layer, the first thickness being greater than the second thickness.

11. The method of claim 9, wherein:
during the initial cycle and the one or more subsequent cycles, the protective layer is deposited over a top surface of the patterned layer and along a top surface of the underlying layer exposed by the patterned layer, and
during the one or more subsequent cycles, the protective layer is further deposited along sidewall surfaces of the underlying layer in the recesses.

12. The method of claim 9, wherein the patterned layer comprises at least one of silicon nitride, silicon oxide (SiO2), silicon oxynitride (SiON), a silicon-containing anti-reflective coating, or an organic material.

13. The method of claim 9, wherein:
the silicon-based precursor of the first processing gas is silicon tetrachloride (SiCl4) or silicon tetrafluoride (SiF4); and
the carrier gas comprises at least one of helium (He), nitrogen (N2), hydrogen (H2) or argon (Ar).

14. The method of claim 9, wherein the second processing gas further comprises a sulfur-containing gas.

15. A method of forming a semiconductor device, the method comprising:
receiving a substrate having an etch mask layer positioned over an underlying hard mask layer to be etched, the etch mask layer having a pattern for patterning the underlying hard mask layer; and
patterning, through an initial cycle and one or more subsequent cycles of a cyclic etching process, the underlying hard mask layer using the etch mask layer to gradually form a recess in the underlying hard mask layer according to the pattern, the initial cycle and the one or more subsequent cycles each comprising:
depositing, in a deposition step and using a first plasma, a silicon-containing protective layer over the etch mask layer and the underlying hard mask layer such that the silicon-containing protective layer covers exposed surfaces of the underlying hard mask layer; and
subsequent to the deposition step, etching, in an etch step and using a second plasma, the underlying hard mask layer to form an incremental portion of the recess in the underlying hard mask layer, the second plasma comprising oxygen,
wherein the incremental portion of the initial cycle of the cyclic etching process is an initial portion of the recess in the underlying hard mask layer such that the deposition step of the initial cycle is performed prior to forming the initial portion of the recess in the underlying hard mask layer.

16. The method of claim 15, wherein:
the exposed surfaces of the underlying hard mask layer comprise a top surface of the underlying hard mask layer, and
for the initial cycle of the cyclic etching process, depositing the silicon-containing protective layer over the etch mask layer and the underlying hard mask layer forms the silicon-containing protective layer to a first thickness over a top surface of the etch mask layer and a second thickness along the top surface of the underlying hard mask layer, the first thickness being greater than the second thickness.

17. The method of claim 15, wherein, for each of the one or more subsequent cycles, the silicon-containing protective layer is further deposited on sidewall surfaces of the underlying hard mask layer in the recess.

18. The method of claim 15, wherein:
- an additional underlying layer underlies the underlying hard mask layer; and
- the method comprises performing the cyclic etching process until a top surface of the additional underlying layer is exposed in the recess.

19. The method of claim 15, wherein, in association with each of the initial cycle and the one or more subsequent cycles of the cyclic etching process, as a result of etching the underlying hard mask layer to form an incremental portion of the recess in the underlying hard mask layer:
- the silicon-containing protective layer over top surfaces of the etch mask layer is partially etched; and
- the silicon-containing protective layer covering the exposed surfaces of the underlying hard mask layer at a bottom of the recess is etched through to facilitate forming the incremental portion of the recess in the underlying hard mask layer.

20. The method of claim 1, wherein:
- the cyclic process is performed using a plasma tool that comprises a source radio frequency (RF) power and a bias RF power; and
- for each of the initial cycle and the one or more subsequent cycles of the cyclic process:
  - the source RF power is on and the bias RF power is off for depositing, using the first plasma, the protective layer over the patterned layer and the one or more exposed surfaces of the ACL; and
  - both the source RF power and the bias RF power are on for etching, using the second plasma, the incremental portion of the recess in the ACL.

* * * * *